US008654584B2

(12) United States Patent
Kim et al.

(10) Patent No.: US 8,654,584 B2
(45) Date of Patent: Feb. 18, 2014

(54) THREE-DIMENSIONAL NON-VOLATILE MEMORY DEVICES HAVING HIGHLY INTEGRATED STRING SELECTION AND SENSE AMPLIFIER CIRCUITS THEREIN

(75) Inventors: Kinam Kim, Seoul (KR); Yongjik Park, Gyeonggi-do (KR); Siyoung Choi, Gyeonggi-do (KR); Hyoungsub Kim, Gyeonggi-do (KR); Jaehoon Jang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 185 days.

(21) Appl. No.: 13/114,790

(22) Filed: May 24, 2011

(65) Prior Publication Data

US 2011/0292731 A1 Dec. 1, 2011

(30) Foreign Application Priority Data

May 25, 2010 (KR) ........................ 10-2010-0048793

(51) Int. Cl.
*G11C 11/34* (2006.01)
(52) U.S. Cl.
USPC .................................................. 365/185.17
(58) Field of Classification Search
USPC ........................................ 365/185.07, 185.17
See application file for complete search history.

(56) References Cited

U.S. PATENT DOCUMENTS

| 2008/0173928 | A1* | 7/2008 | Arai et al. ...................... 257/316 |
| 2009/0090960 | A1 | 4/2009 | Izumi et al. |
| 2009/0278193 | A1* | 11/2009 | Murata et al. .................. 257/324 |
| 2010/0177566 | A1* | 7/2010 | Kim et al. ................ 365/185.17 |

FOREIGN PATENT DOCUMENTS

| JP | 2002-368140 | 12/2002 |
| JP | 2008-159699 | 7/2008 |
| JP | 2009-094236 | 4/2009 |
| KR | 1020080058251 A | 6/2008 |

OTHER PUBLICATIONS

Kim et al. "Novel Vertical-Stacked-Array-Transistor (VSAT) for Ultra-High-Density and Cost-Effective NAND Flash Memory Devices and SSD (Solid State Drive)" VLSI VSAT-UCLA Thesis, 2009.

* cited by examiner

*Primary Examiner* — Anthan Tran
(74) *Attorney, Agent, or Firm* — Myers Bigel Sibley & Sajovec, P.A.

(57) ABSTRACT

Nonvolatile memory devices include an electrically insulating layer on a semiconductor substrate and a NAND-type string of nonvolatile memory cells on an upper surface of the electrically insulating layer. The NAND-type string of nonvolatile memory cells includes a plurality of vertically-stacked nonvolatile memory cell sub-strings disposed at side-by-side locations on the electrically insulating layer. A string selection transistor is provided, which includes a gate electrode extending between the electrically insulating layer and the semiconductor substrate and source and drain regions in the semiconductor substrate. A ground selection transistor is provided, which includes a gate electrode extending between the electrically insulating layer and the semiconductor substrate and source and drain regions in the semiconductor substrate.

8 Claims, 26 Drawing Sheets

THREE-DIMENSIONAL NON-VOLATILE MEMORY DEVICES HAVING HIGHLY INTEGRATED STRING SELECTION AND SENSE AMPLIFIER CIRCUITS THEREIN

REFERENCE TO PRIORITY APPLICATION

This application claims priority to Korean Patent Application No. 10-2010-0048793, filed May 25, 2010, the contents of which are hereby incorporated herein by reference.

FIELD

The present invention relates to semiconductor memory devices and, more particularly, to non-volatile semiconductor memory devices.

BACKGROUND

Higher integration of semiconductor devices is required to satisfy consumer demands for superior performance and inexpensive prices. In the case of memory semiconductor devices, since their integration is an important factor in determining product price, increased integration is especially required. In the case of typical two-dimensional or planar memory semiconductor devices, since their integration is mainly determined by the area occupied by a unit memory cell, integration is greatly influenced by the level of fine pattern forming technology. However, since extremely expensive semiconductor equipments are needed for increasing pattern fineness, integration of two-dimensional memory devices is increasing but is still limited.

As an alternative to overcome such a limitation, there have been proposed three-dimensional semiconductor memory devices. However, for mass production of three-dimensional semiconductor memory devices, process technology that can decrease fabricating cost per bit compared with two-dimensional semiconductor memory devices and realize reliable product characteristics is required.

SUMMARY OF THE INVENTION

Nonvolatile memory devices according to embodiments of the invention include an electrically insulating layer on a semiconductor substrate and a NAND-type string of nonvolatile memory cells on the electrically insulating layer. The NAND-type string of nonvolatile memory cells includes a plurality of vertically-stacked nonvolatile memory cell substrings disposed at side-by-side locations on the electrically insulating layer. A string selection transistor is provided, which includes a gate electrode extending between the electrically insulating layer and the semiconductor substrate and source and drain regions in the semiconductor substrate. A ground selection transistor is provided, which includes a gate electrode extending between the electrically insulating layer and the semiconductor substrate and source and drain regions in the semiconductor substrate. An electrically conductive string selection plug is provided, which extends through the electrically insulating layer. This string selection plug electrically connects a drain terminal of a first of the nonvolatile memory cells in the NAND-type string to the source of the string selection transistor. An electrically conductive ground selection plug is provided, which extends through the electrically insulating layer. This ground selection plug electrically connects a source terminal of a last of the nonvolatile memory cells in the NAND-type string to the drain of the ground selection transistor.

According to some embodiments of the invention, the electrically insulating layer includes an upper interlayer insulating layer on the string selection transistor and on the ground selection transistor. The memory device may further include a bit line electrically connected to the drain of the string selection transistor. The bit line extends between the interlayer insulating layer and the semiconductor substrate. A common source line is also provided, which is electrically connected to the source of the ground selection transistor. The common source line extends between the interlayer insulating layer and the semiconductor substrate.

According to additional embodiments of the invention, a sense amplifier is provided, which extends between the string and ground selection transistors and extends between the interlayer insulating layer and the semiconductor substrate. A column decoder is provided, which is electrically coupled to the sense amplifier. The column decoder extends between the string and ground selection transistors. In some of these embodiments of the invention, at least a portion of the sense amplifier extends between the NAND-type string on nonvolatile memory cells and the semiconductor substrate and at least a portion of the column decoder extends between the NAND-type string on nonvolatile memory cells and the semiconductor substrate.

According to still further embodiments of the invention, a nonvolatile memory device is provided, which includes a row of ground select transistors and a row of string select transistors in a semiconductor substrate along with a sense amplifier circuit, which extends between the row of ground select transistors and the row of string select transistors. An electrically insulating layer is provided on the rows of ground select transistors and string select transistors. A plurality of NAND-type strings of nonvolatile memory cells is disposed at side-by-side locations on the electrically insulating layer. The plurality of NAND-type strings of nonvolatile memory cells extends opposite the sense amplifier circuit in the semiconductor substrate. Each of the plurality of NAND-type strings of nonvolatile memory cells is electrically coupled to a corresponding one of the ground select transistors in the row of ground select transistors and a corresponding one of the string select transistors in the row of string select transistors.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
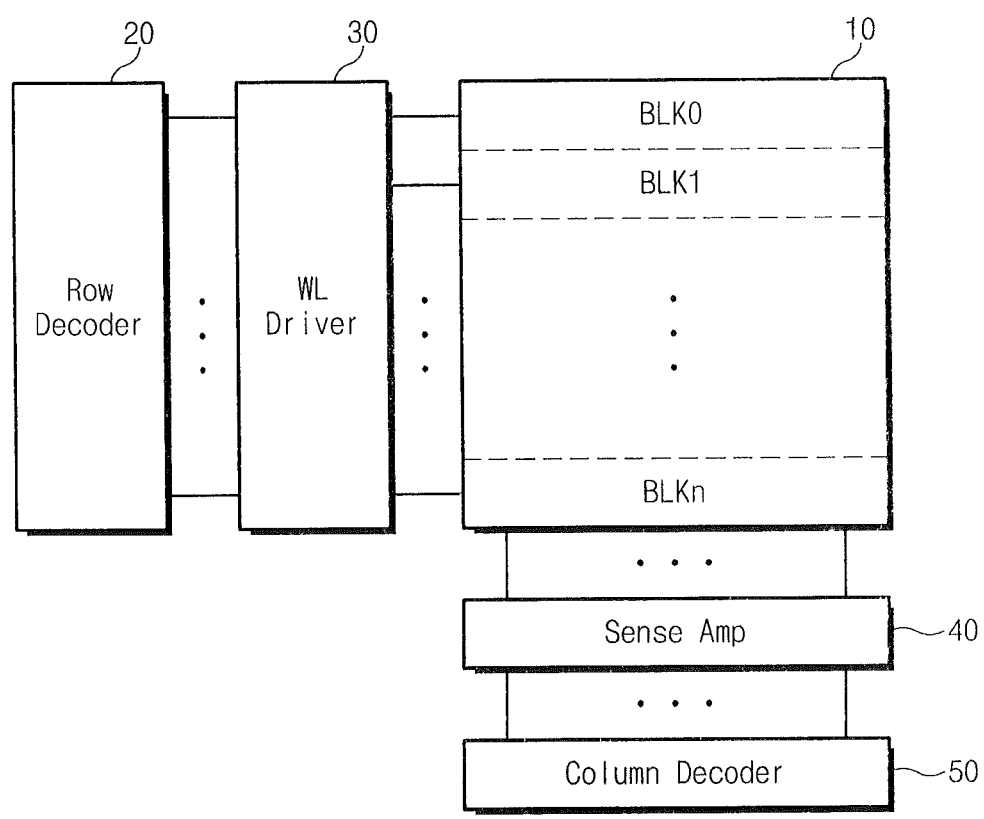
FIG. 1 is a block diagram of a three-dimensional semiconductor memory device according to an embodiment of the inventive concept.

Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art, and the inventive concept is only defined by scopes of claims. Like reference numerals refer to like elements throughout.

While specific terms were used in the specification, they were not used to limit the inventive concept, but merely used to explain the exemplary embodiments. In the inventive concept, the terms of a singular form may include plural forms unless otherwise specified. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto. Further, in the specification, it will also be understood that when a layer (or film) is referred to as being 'on' another layer or substrate, it can be directly on the other layer or substrate, or intervening layers may also be present.

Additionally, the embodiments in the detailed description will be described with sectional views and/or plan views as ideal exemplary views of the inventive concept. In the drawings, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a device region. Thus, this should not be construed as limited to the scope of the inventive concept.

FIG. 1 is a block diagram of a three-dimensional semiconductor memory device according to an embodiment of the inventive concept. Referring to FIG. 1, the three-dimensional semiconductor memory device includes a memory cell array 10, a row decoder 20, a word line driver 30, a sense amp 40 and a column decoder 50. The memory cell array 10 includes a plurality of word lines, bit lines and memory cells, thereby enabling to store data. Also, a predetermined number of memory cells may constitute memory blocks BLK0-BLKn which are data erase units. The memory cell array 10 will be described in detail with reference to FIG. 2. The row decoder 20 selects the memory blocks BLK0-BLKn of the memory cell array 10 according to address data, and selects the word line of the selected memory block. The word line driver 30 drives the word lines, which are selected by the row decoder 20, with a program voltage or pass voltage. For example, the word line driver 30 drives the word line connected to a selected memory cell with the program voltage, and drives the word line connected to a non-selected memory cell with the pass voltage. The sense amp 40 senses and amplifies 9 voltage on the bit line selected during a read operation mode. Although not illustrated in the drawings, the sense amp 40 may include page buffers connected to the bit lines, respectively or the bit line pairs, respectively. The column decoder 50 may provide a data transfer path between the pager buffers and the outside (e.g., a memory controller).

Figure 2:
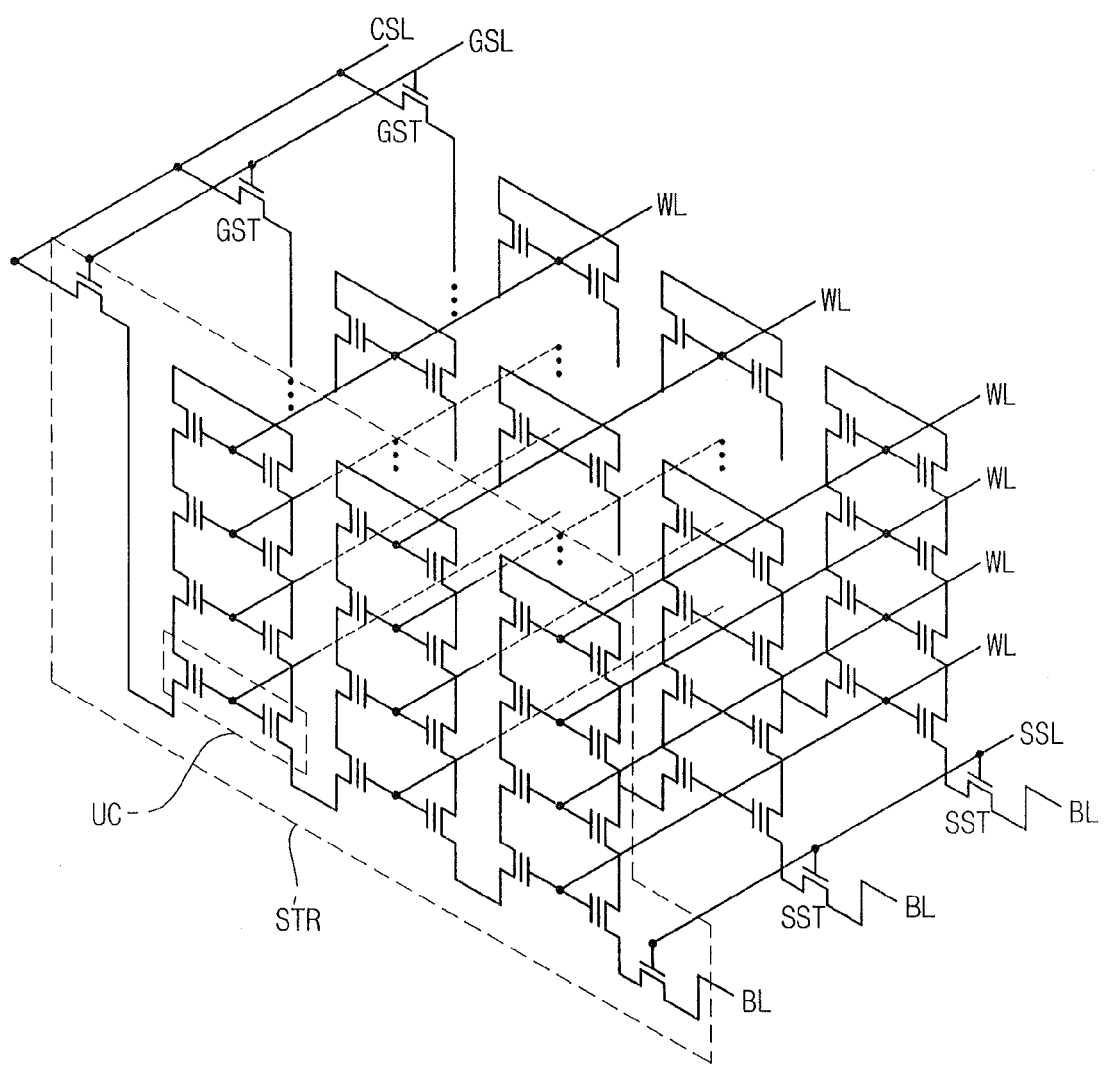
FIG. 2 is a circuit diagram of a cell array of a three-dimensional semiconductor memory device according to an embodiment of the inventive concept.

FIG. 2 is a circuit diagram of a cell array of a three-dimensional semiconductor memory device according to an embodiment of the inventive concept. Referring to FIG. 2, when briefly describing about the structure of the cell array according to the embodiments of the inventive concept, the cell array includes a plurality of cell strings STR, and each cell string STR is composed of a bit line BL, a common source electrode CSL, and a plurality of unit memory cells UC serially connected therebetween. Also, the cell string STR includes a string selection transistor SST between the bit line BL and the unit memory cell UC, and a ground selection transistor GST between the common source electrode CSL and the unit memory cells UC.

Figure 3:
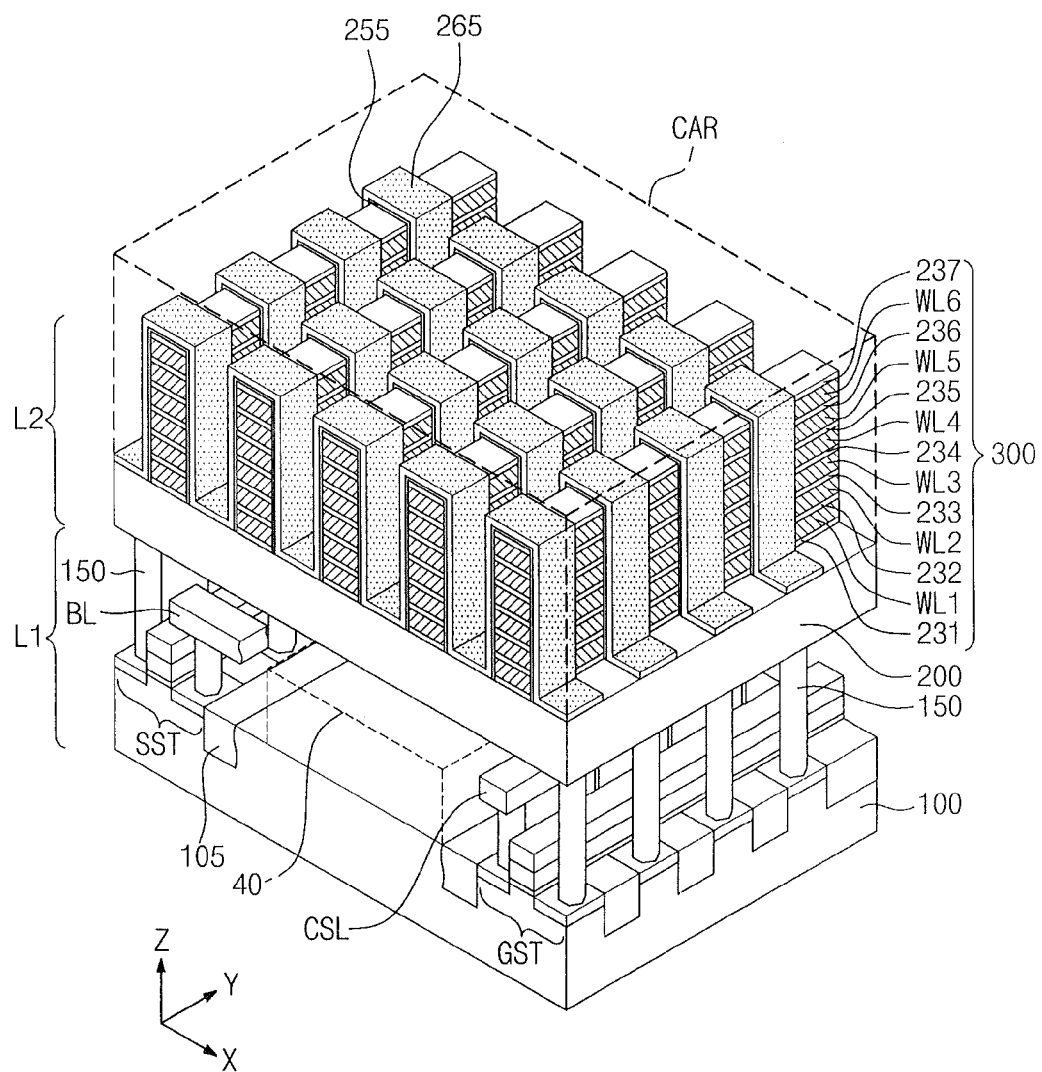
FIG. 3 is a perspective view illustrating a three-dimensional semiconductor memory device according to an embodiment of the inventive concept.
Figure 4:
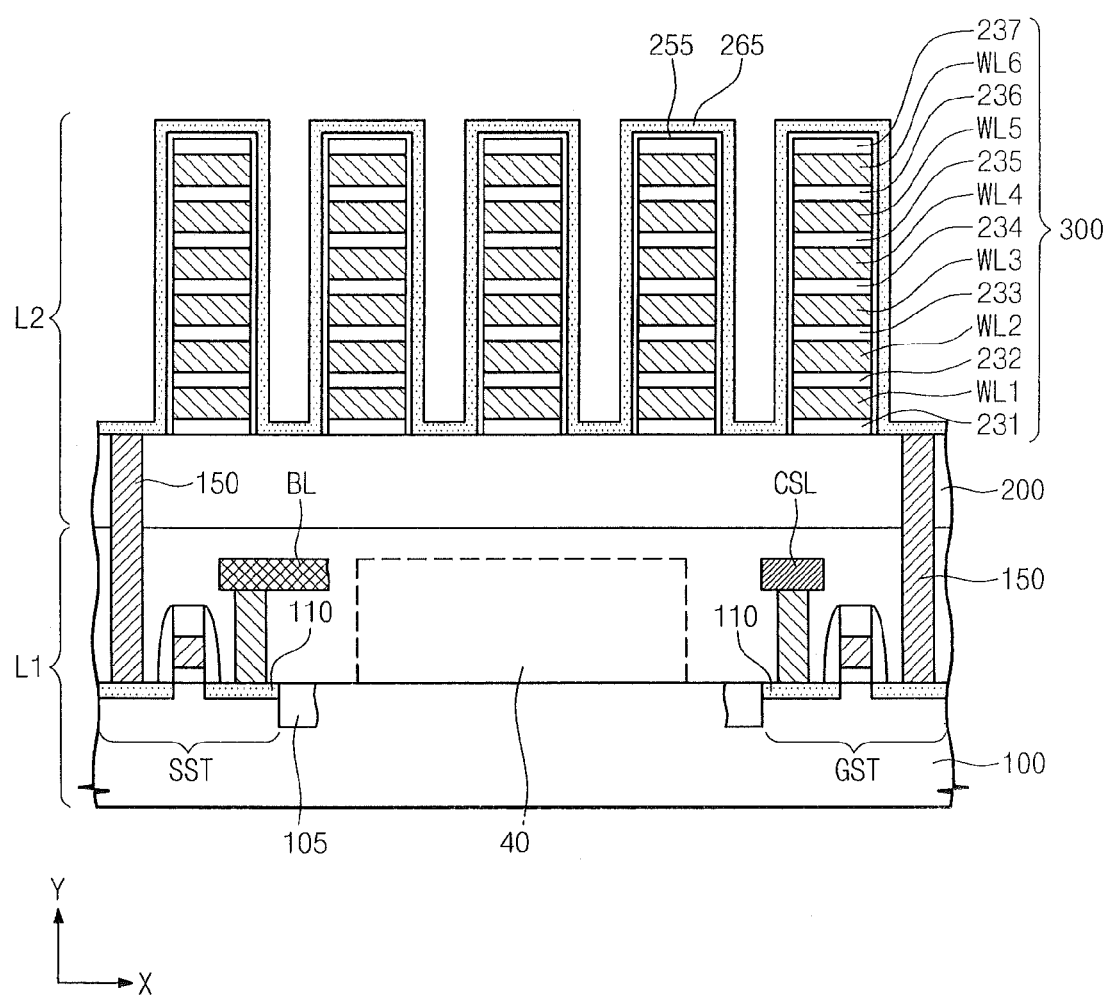
FIG. 4 is a cross-sectional view of a three-dimensional semiconductor memory device according to an embodiment of the inventive concept, which represents an x-z cross-section in FIG. 3.

Referring to FIGS. 3 through 7, the structure of a cell array according to the embodiments of the inventive concept will be described in detail. FIG. 3 is a perspective view illustrating a three-dimensional semiconductor memory device according to an embodiment of the inventive concept. FIG. 4 is a cross-sectional view of a three-dimensional semiconductor memory device according to an embodiment of the inventive concept, which represents an x-z cross-section in FIG. 3. Referring to FIGS. 3 and 4, the three-dimensional memory device includes a non-memory layer L1 and a memory layer L2 vertically stacked, and the memory layer L2 may be disposed on the non-memory layer L1. The non-memory layer L1 includes a semiconductor substrate 100, a string selection transistor SST and a ground selection transistor GST constituting a cell string STR, and non-memory circuits. The memory layer L2 includes a cell array region CAR and a word line contact region (not illustrated), and the cell array region CAR includes unit cells (UC in FIG. 2) which are serially connected to the string and ground selection transistors SST and GST. The unit memory cells (UC in FIG. 2) are three-dimensionally disposed on an insulation layer 200. Further, the unit memory cells (UC in FIG. 2) are electrically connected to the selection transistors SST and GST disposed thereunder to constitute the cell string (STR in FIG. 2). The word line contact region will be described in detail with reference to FIGS. 13 through 17.

When describing about the non-memory layer L1 in more detail, the semiconductor substrate 100 may be a single crystal semiconductor (e.g., a p-type silicon wafer) having a first conductive type. The semiconductor substrate 100 may have a region (that is, a well region) which is electrically separated by other conductive impurity regions. The well region may be formed in plurality in one semiconductor substrate 100, and the well regions may be formed as a pocket well structure or a triple well structure. In addition, a device isolation layer 105 is formed on the semiconductor substrate 100, thereby enabling to isolate electrical devices.

The string selection transistor SST using a string selection line SSL as a gate electrode, and the ground selection transistor GST using a ground selection line GSL as the gate electrode are spaced apart from each other and disposed on the semiconductor substrate 100. The ground selection transistors GST and the string selection transistors SST may be a metal-oxide-semiconductor field-effect-transistor (MOSFET) which uses the semiconductor substrate 100 as a channel region. Therefore, in both sides of the ground selection line GSL of the semiconductor substrate 100 and in both sides of the string selection transistor SST of the semiconductor substrate 100, impurity regions 110, which are used as source and drain electrodes of the selection transistors SST and GST, may be formed. According to an embodiment, the impurity regions 110 may be formed to have a conductive type different from the semiconductor substrate 100. Additionally, source electrodes of ground selection transistors GST may be commonly connected to a common source line CSL which is parallel to a word line WL, and respective drain electrodes of the ground selection transistors GST may be connected to one end of each of semiconductor patterns 265 of the memory layer L2. Also, the drain electrodes of the string selection transistors SST are connected to bit lines BL having major axes of direction crossing the word line WL, and the source electrodes of the string selection transistors SST may be connected to other end of the semiconductor pattern 265.

According to an embodiment, the selection transistors SST and GST may be disposed under the semiconductor pattern 265 and word line structures 300. Also, the bit line BL and the common source line CSL may be disposed under the semiconductor pattern 265 and the word line structure 300. That is, the selection transistors SST and GST may be disposed under the cell array region CAR, thereby enabling to reduce the horizontal area occupied by the selection transistors SST and GST. Therefore, a three-dimensional semiconductor memory device may be more highly integrated. Further, in the non-memory layer L1, non-memory circuits may be integrated on the semiconductor substrate 100. The non-memory circuit may include row and column decoders 20 and 50, a word line driver 30 and a sense amp 40 which are described in FIG. 1.

Also, the non-memory circuit may include a high voltage generating circuit, a level shifter, a read verification circuit and an input/output interface circuit or the like.

According to an embodiment, the non-memory circuit may be integrated on the semiconductor substrate 100 between the string selection transistor SST and the ground selection transistor GST. For example, the sense amps 40 connecting to the bit line BL may be disposed on the semiconductor substrate 100 between the string selection transistor SST and the ground selection transistor GST. The sense amp 40 may include n-type and p-type MOSFETs which use the semiconductor substrate 100 as a channel region. Also, the sense amp 40 may be disposed under the semiconductor pattern 265 and the word line structures 300. That is, the sense amp 40 is disposed in the horizontal area occupied by the cell array region CAR. The layout structure of non-memory circuits in the non-memory layer L1 will be described in more detail with reference to FIGS. 8 through 12.

According to an embodiment, the non-memory circuits disposed in the non-memory layer L1 may be covered by an insulation layer 200. The insulation layer 200 may be formed of a boron-phosphor silicate glass (BPSG) layer, a high-density plasma (HDP) oxide layer, a tetra ethyl ortho silicate (TEOS) layer, an undoped silicate glass (USG), or tonen silazene (TOSZ) material which has excellent gap fill characteristics. According to another embodiment, a semiconductor layer or a semiconductor substrate may be disposed on the insulation layer 200. Also, although one insulation layer 200 is illustrated in the drawing, a multilayer structure of interconnection lines may be formed between the semiconductor substrate 100 and the insulation layer 200, and as a result, a plurality of interlayer insulation layers may be stacked.

A plurality of unit memory cells (UC in FIG. 2) may be formed on the insulation layer 200 of the memory layer L2. Specifically, at least one of the word line structures 300 and at least one of the semiconductor patterns 265 are disposed on the insulation layer 200. A data storage pattern 255 is disposed between the word line structure 300 and the semiconductor pattern 265. The word line structure 300, which will be described with reference to FIGS. 6 and 7, includes a stacked plurality of word lines WL1-WL6. The memory cells, which are three-dimensionally disposed on the insulation layer 200, use the word lines WL1-WL6 as gate electrodes, and may be MOSFETs using the semiconductor pattern 265 as a channel.

According to an embodiment, the semiconductor pattern 265 may be disposed across the plurality of word line structures 300. That is, the semiconductor pattern 265, as illustrated, is extended from one side of the word line structure 300 and may connect to the other semiconductor pattern 265 which is disposed at the other side of the word line structure 300. In this case, the semiconductor pattern 265 may also be disposed on the upper surface of the word line structure 300. The semiconductor patterns 265 may connect each other at the top surface of the insulation layer 200 between the word line structures 300. That is, as illustrated, the semiconductor patterns 265 may be formed as a line shape which covers side and top surfaces of the word line structures 300 while crossing the plurality of word line structures 300.

Also, at both end portions of the semiconductor patterns 265 crossing the plurality of word line structures 300, an impurity region may be formed for electrical connections to the selection transistors SST and GST. Further, the impurity region may be also formed in the semiconductor pattern 265 between the word line structures 300, thus enabling to form an electrical path which crosses the word line structures 300 during a programming and a read operation of a memory device. One end portion of the semiconductor pattern 265 may be disposed on a source electrode of the string selection transistor SST, and the other end portion may be disposed on a drain electrode of the ground selection transistor GST.

According to an embodiment, the semiconductor pattern 265 may be electrically connected to the selection transistors SST and GST disposed in the non-memory layer L1 through a string connection structure 150 which penetrates through the insulation layer 200. The string connection structure 150 may directly contact one end portion of the impurity-doped semiconductor pattern 265 and the source electrode of the string selection transistor SST. The string connection structure 150 may also directly contact the other end portion of the impurity-doped semiconductor pattern 265 and the drain electrode of the ground selection transistor GST. The string connection structure 150 may include at least one of a doped semiconductor, metals, metal nitrides and metal silicides. A current path may be formed between the bit line BL and the common source line CSL by the semiconductor pattern 265 which crosses the string connection structure 150 and the plurality of word line structure 300. This string connection structure 150 may be formed before forming the word line structures 300. In this case, the string connection structure 150 may directly contact a bottom surface of the semiconductor pattern 265. According to another embodiment, the string connection structure 150 may be formed after forming the word line structures 300 and the semiconductor patterns 265. In this case, the string connection structure 150 may penetrate through the semiconductor patterns 265.

Figure 5:
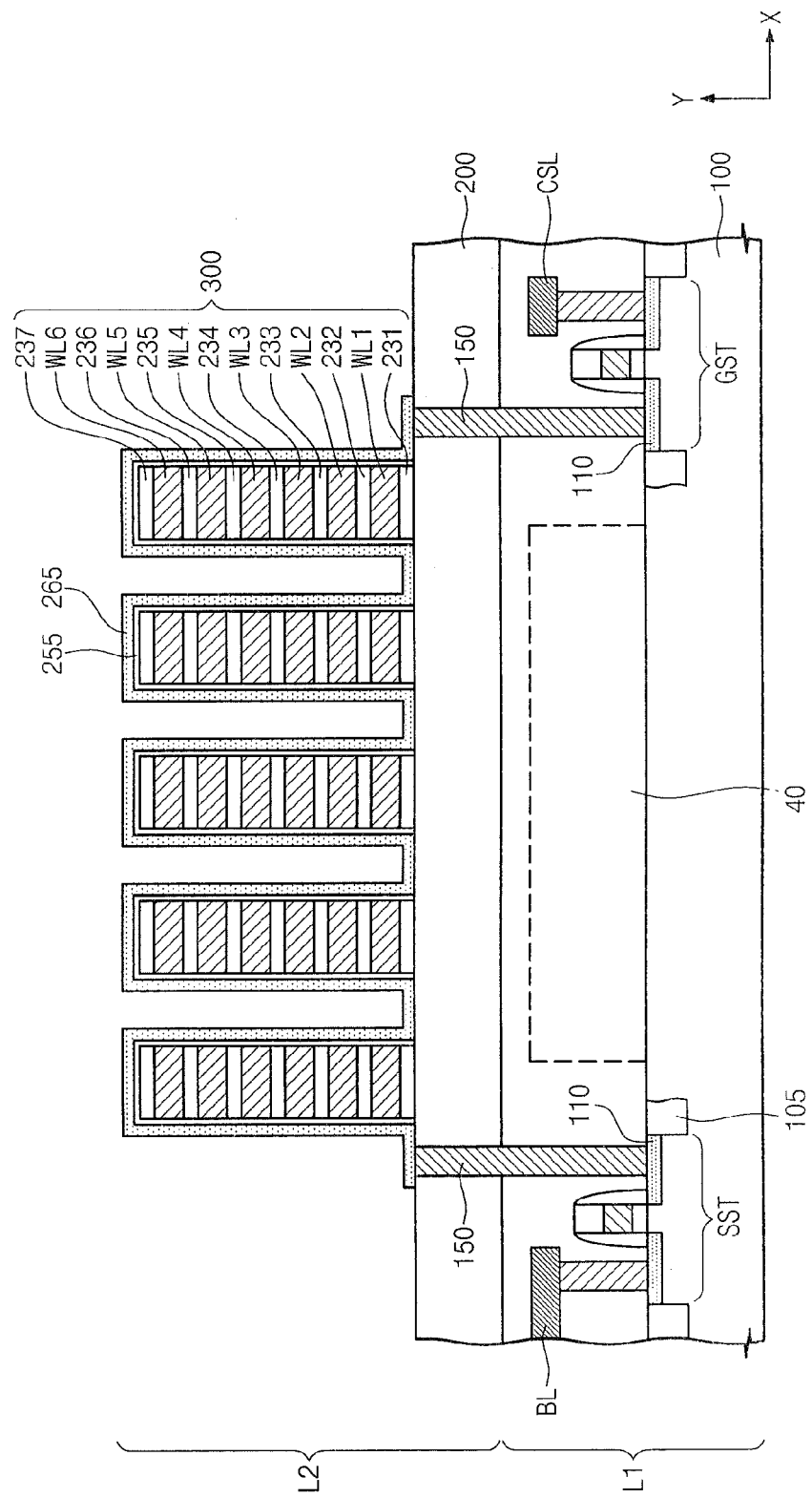
FIG. 5 is a cross-sectional view of a three-dimensional semiconductor memory device for describing a modified embodiment of the inventive concept.

FIG. 5 is a cross-sectional view of a three-dimensional semiconductor memory device according to a modified embodiment of the inventive concept. Referring to FIG. 5, the area of the cell array region CAR may be different according to the number of word line structures 300 and the length of the semiconductor pattern 265 or the like. When the number of word line structures 300 constituting a cell string (STR in FIG. 2) is small, the area of the cell array region CAR may be reduced. As a result, the cell array region CAR may be disposed in plan view between the string selection transistor SST and the ground selection transistor GST. That is, the common source line CSL and the bit line BL may not be disposed under the word line structures 300.

Figure 6:
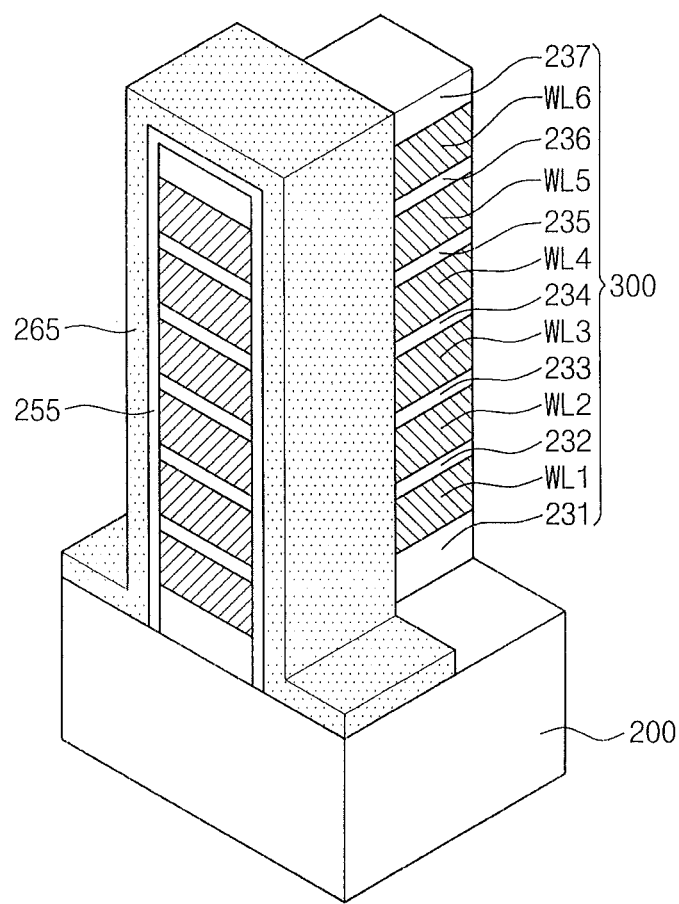
FIG. 6 is a perspective view illustrating a portion of a cell array according to an embodiment of the inventive concept.
Figure 7:
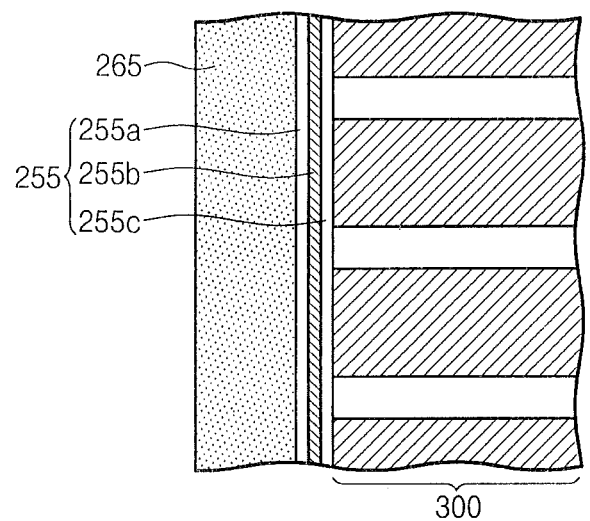
FIG. 7 is a cross-sectional view for describing a data storage pattern according to an embodiment of the inventive concept.

The structure of unit memory cells (UC in FIG. 2), which are three-dimensionally disposed on the insulation layer 200, will be described in more detail with reference to FIGS. 6 and 7. FIG. 6 is a perspective view illustrating a portion of a cell array according to an embodiment of the inventive concept. FIG. 7 is a cross-sectional view for describing a data storage pattern according to an embodiment of the inventive concept.

Referring to FIG. 6, the word line structure 300 is disposed on the insulation layer 200. The word line structure 300 may include insulation patterns 231, 232, 233, 234, 235, 236 and 237, and word lines WL1, WL2, WL3, WL4, WL5 and WL6 sequentially and repeatedly stacked. The word line structure 300 may be formed to have a major axis parallel to the ground selection line GST and the string selection line SST. The word lines WL1-WL6 may include at least one of conductive materials. For example, the word lines WL1-WL6 may include at least one of a doped semiconductor, metals, metal nitrides and metal silicides.

At least one semiconductor pattern 265 may be disposed on the side wall of the word line structure 300, and a data storage pattern 255 may be disposed between the semiconductor pattern 265 and the word line structure 300. The semiconductor pattern 265 may be a single crystal semiconductor pattern or a polycrystalline semiconductor pattern. According to an embodiment, the semiconductor pattern 265 may be an intrinsic semiconductor pattern which is not doped.

According to an aspect of the inventive concept, the word lines WL1-WL6 may control electrical connections of the unit memory cells by controlling the potential of the semiconductor pattern 265. More specifically, the semiconductor pattern 265 may be capacitively coupled with the word lines WL1-WL6 to constitute a metal-oxide-semiconductor (MOS) capacitor. In this case, a voltage applied to the word lines WL1-WL6 may variably control the potential of the semiconductor pattern 265 adjacent thereto, and an energy band of the semiconductor pattern 265 may be inversed according to the voltage applied to the word lines WL1-WL6. Therefore, the electrical connections of the unit memory cells may be controlled by the voltage applied to the word lines WL1-WL6 constituting the word line structure 300.

Meanwhile, these electrical connections are possible when inversion regions overlap each other at the side of the respective word lines WL1-WL6. In order for these inversion regions to overlap each other, interlayer insulation layers 231-237 between the word lines WL1-WL6 may be formed to the thickness less than twice of the maximum thickness of the inversion region. The interlayer insulation layers 231-237 may be layers made of at least one of insulation materials, and may include at least one of a silicon oxide layer, a silicon nitride layer and a silicon oxynitride layer. However, since the uppermost interlayer insulation layer 237 may be used as an etching mask in a subsequent patterning process, the uppermost insulation layer 237 may be formed thicker than other interlayer insulation layers 231-236.

According to an aspect of the inventive concept, the data storage pattern 255, together with the semiconductor pattern 265 and the word lines WL1-WL6, may be used as a capacitor dielectric layer constituting the MOS capacitor. For this purpose, the data storage pattern 255 includes at least one of insulation materials.

According to another aspect of the inventive concept, the data storage pattern 255, together with the semiconductor pattern 265 and the word lines WL1-WL6, may constitute a MOS transistor. In this case, the semiconductor pattern 265 is used as a channel region, and the word lines WL1-WL6 are used as a gate electrode, and the data storage pattern 255 is used as a gate insulation layer. At this time, since some region of the semiconductor pattern 265 on the side surface of the data storage pattern 255 may be inversed by the applied voltage, the region may be used as a source/drain electrode of the MOS transistor. Also, since the semiconductor pattern 255 is disposed on the side walls of the word lines WL1-WL6, a current direction of the MOS transistor using the semiconductor pattern 255 as the channel region is vertical to an upper surface of the insulation layer.

The data storage pattern 255 includes an insulation material, and may include at least one of a silicon oxide layer, a silicon nitride layer, a silicon oxynitride layer and high-k dielectric layers. The high-k dielectric layers mean the insulation materials which have higher dielectric constant than the silicon oxide layer, and may include a tantalum oxide layer, a titanium oxide layer, a hafnium oxide layer, a zirconium oxide layer, an aluminum oxide layer, a yttrium oxide layer, a niobium oxide layer, a cesium oxide layer, an indium oxide layer, an iridium oxide layer, a barium strontium titanate (BST) layer and a lead zirconium titanate (PZT) layer. The data storage pattern 255 will be described in detail with reference to FIG. 7.

Referring to FIG. 7, the data storage pattern 255 may include a tunnel insulation layer 255a adjacent to the semiconductor pattern 265, a blocking insulation layer 255c adjacent to the word line structure 300, and a charge storage layer 255b disposed between the tunnel insulation layer 255a and the blocking insulation layer 255c. The blocking insulation layer 255c may include at least one of a silicon oxide layer, a silicon nitride layer, a silicon oxynitride layer and high-k dielectric layers, and according to an embodiment, may be a multilayered thin film including a high-k dielectric layer. The tunnel insulation layer 255a may be formed of a material having a lower dielectric constant than the blocking insulation layer 255c, and the charge storage layer 255b is an insulation thin film (for example, a silicon nitride layer) having abundant charge trap sites, or may be the insulation thin film including conductive particles. According to an embodiment, the tunnel insulation layer 255a may be a silicon oxide layer, the charge storage layer 255b may be a silicon nitride layer, and the blocking insulation layer 255c may be an insulation layer including an aluminum oxide layer. In this case, the word lines WL1-WL6 may include a tantalum nitride layer.

FIGS. 8 through 12 are drawings for describing the layout structures of non-memory circuits in three-dimensional semiconductor memory devices according to embodiments of the inventive concept. Referring to FIGS. 8 through 12, a semiconductor substrate 100 includes at least one memory region MR and a peripheral region PR surrounding the memory region MR. String and ground selection transistors SST and GST may be integrated on the semiconductor substrate 100 of the memory region MR, and the non-memory circuits may be integrated on the semiconductor substrate 100 of the peripheral region PR. The non-memory circuits of the non-memory layer L1, as described earlier, may include row and column decoders 20 and 50, a word line driver 30, a sense amp 40 and a control circuit 60 or the like. Referring to FIGS. 8 through 12, the string selection transistor SST and the ground selection transistor GST, which are connected to memory cells of a cell array region CAR, may be spaced apart from each other and disposed on the semiconductor substrate 100.

Figure 8:
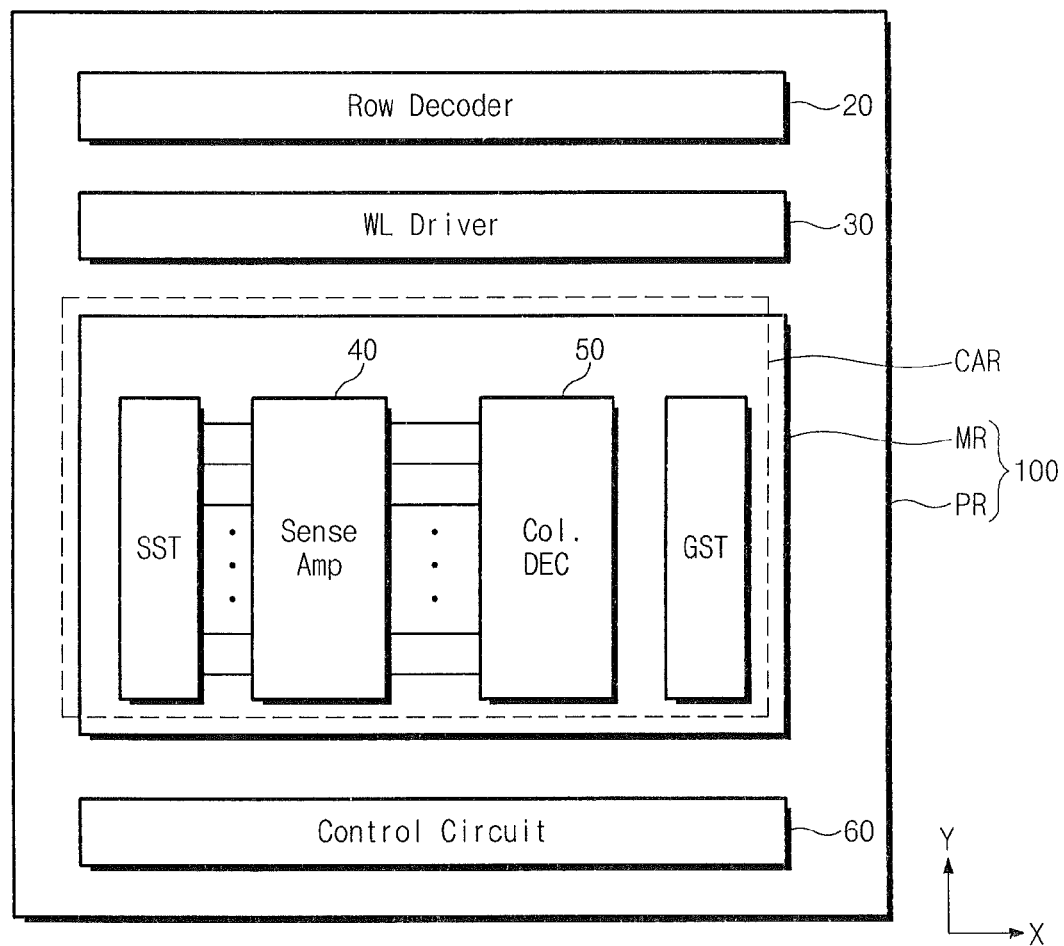
FIGS. 8 through 12 are drawings for describing the disposition structure of non-memory circuits in a three-dimensional semiconductor memory device according to an embodiment of the inventive concept.

According to the embodiment illustrated in FIG. 8, the sense amps 40 and the column decoder 50 connected to a bit line BL may be disposed between the string selection transistor SST and the ground selection transistor GST. Also, the selection transistors SST and GST, the sense amps 40, and the column decoder 50 may be disposed in the memory region MR under the cell array region CAR. The cell array region CAR, as described with reference to FIG. 3, includes unit memory cells arranged three-dimensionally. According to another embodiment, a row decoder 20, a word line driver 30 and a control circuit 60 may be disposed under the cell array region CAR.

Figure 9:
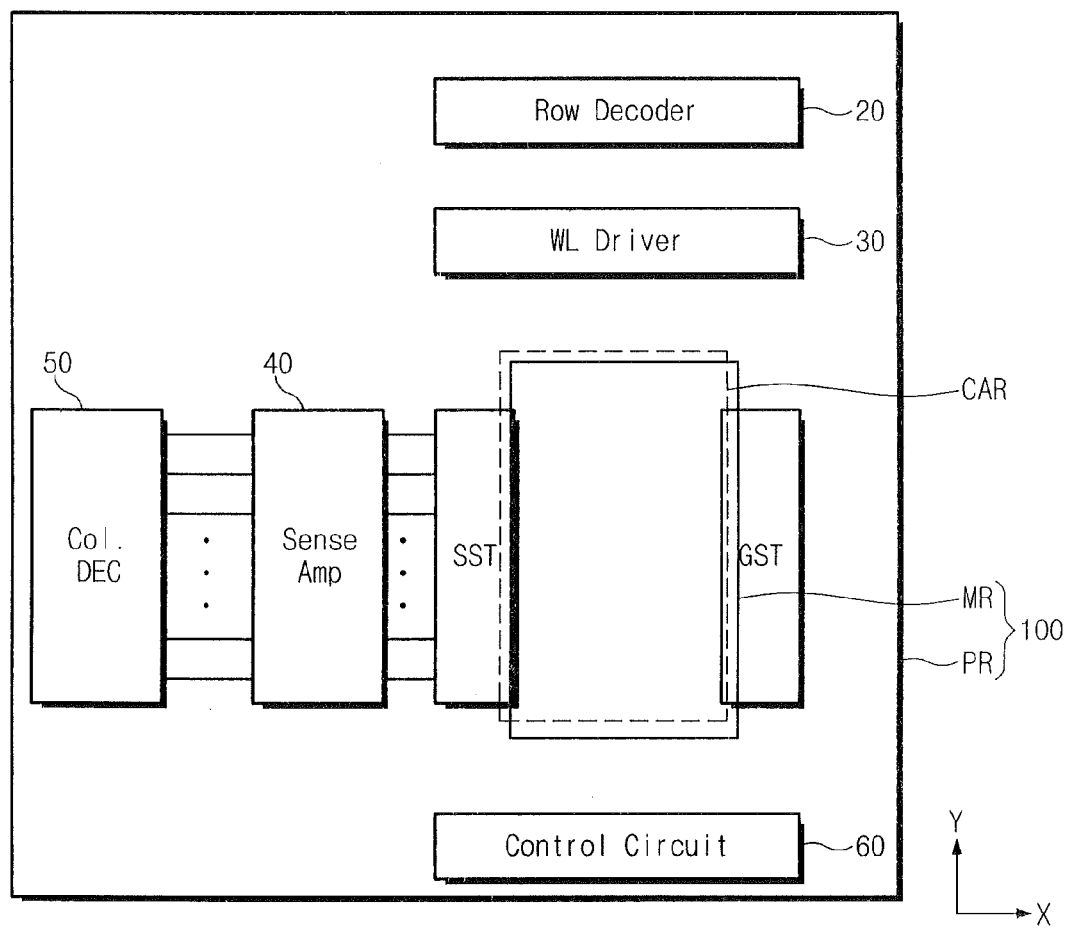

According to the embodiment illustrated in FIG. 9, a cell array region CAR may be disposed in plan view between a string selection transistor SST and a ground selection transistor GST. Also, non-memory circuits 20, 30, 40, 50 and 60 may be disposed around the cell array region CAR. According to another embodiment, a cell array region CAR may be disposed in plan view between a string selection transistor SST and a ground selection transistor GST, and a sense amp 40 and a column decoder 50 may be disposed under the cell array region CAR. The string selection transistor SST and the ground selection transistor GST may be disposed overlapping a memory region MR and a peripheral region PR.

Figure 10:
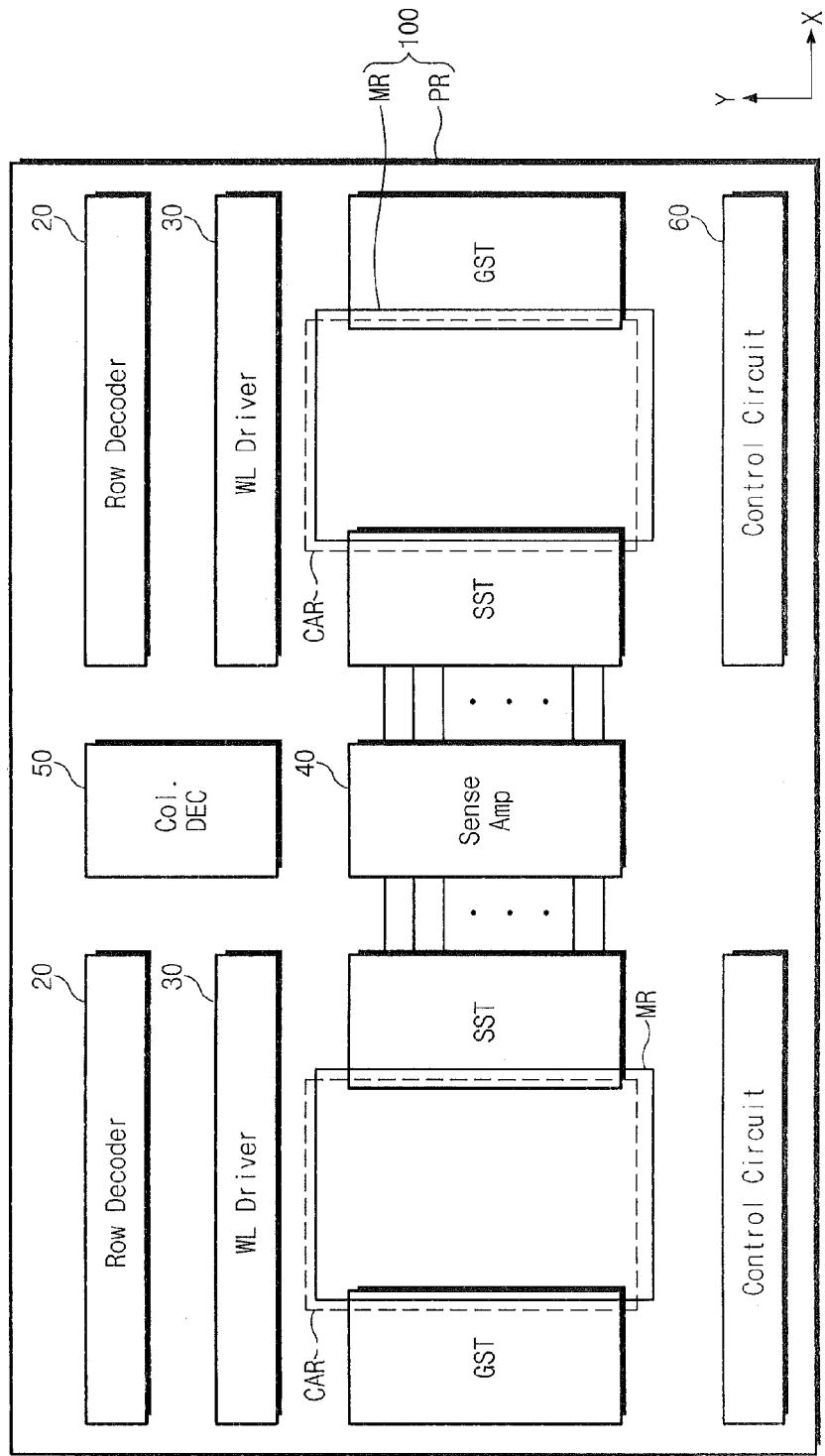
Figure 11:
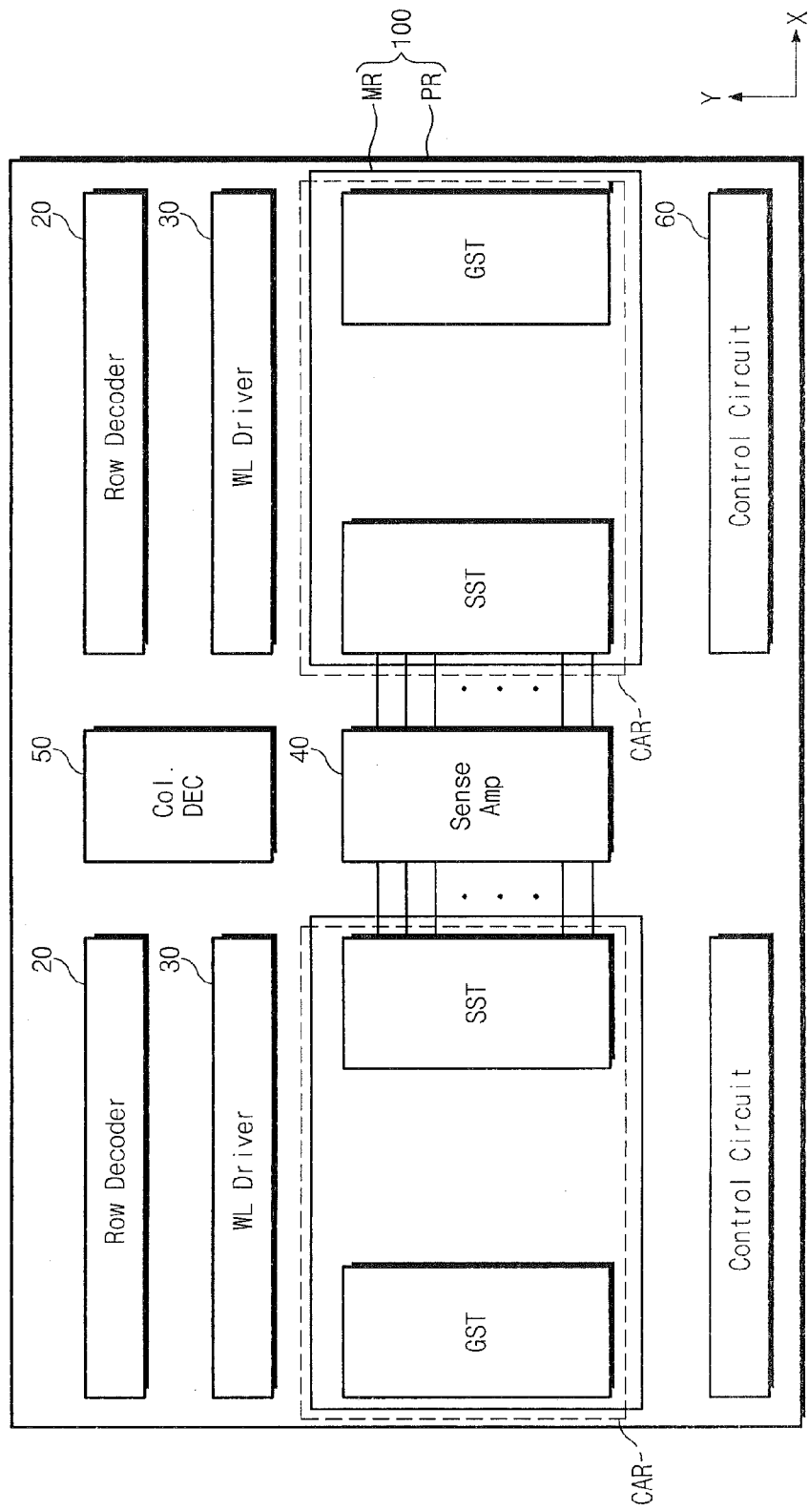

Also, according to the embodiments illustrated in FIGS. 10 and 11, at least two or more memory regions MR may be arranged in the x-axis direction of a semiconductor substrate 100. Likewise, at least two or more than cell array regions CAR may be arranged in the x-axis direction. Each of the cell array regions CAR may be disposed on the memory region MR. Further, as illustrated in FIGS. 10 and 11, the adjacent cell array regions CAR may share the sense amp 40 and the column decoder 50. That is, the sense amp 40 and the column decoder 50 may be disposed on the semiconductor substrate 100 between the adjacent memory regions MR, i.e., between adjacent string selection transistors SST. Referring to FIG. 10, each cell array region CAR may be disposed in plan view between the string and ground selection transistors SST and GST. The string and ground selection transistors SST and GST may be extended from the memory region MR to a peripheral region PR. As illustrated in FIG. 11, the string and ground selection transistors SST and GST spaced apart from each other may be disposed in each memory region MR.

Figure 12:
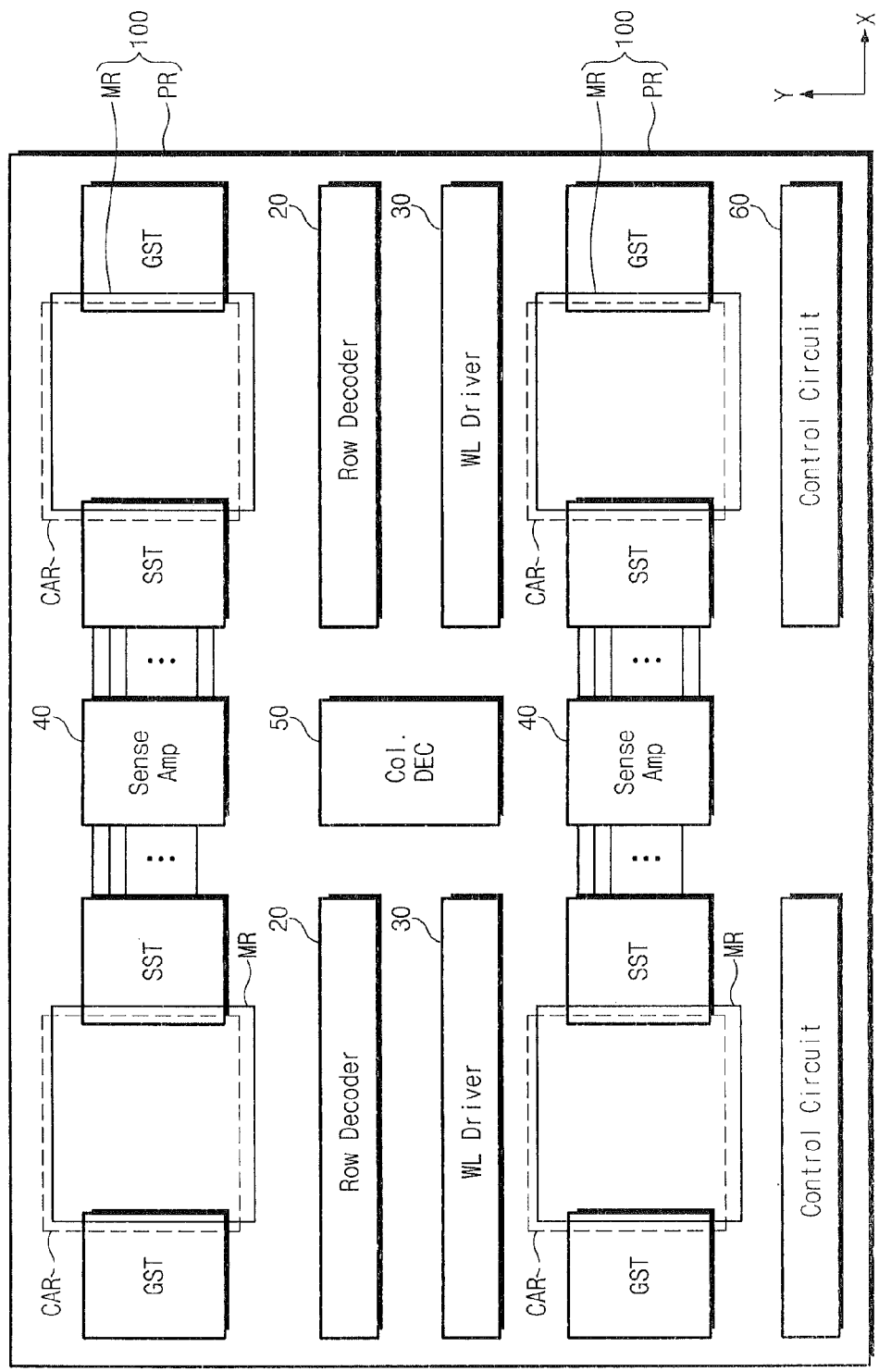

Also, according to the embodiment illustrated in FIG. 12, at least two or more than memory regions MR may be arranged in the x-axis and y-axis directions of a semiconductor substrate 100, and cell array regions CAR may be disposed on the memory regions MR. That is, at least two or more than memory regions MR may be arranged in the x-axis and y-axis directions. Each of the cell array regions CAR may be disposed in plan view between string and ground selection transistors SST and GST. Further, as described with reference to FIGS. 9 and 10, the string and ground selection transistors SST and GST may be disposed under the cell array regions CAR. According to this embodiment, the cell array regions CAR adjacent to each other in the x-axis direction may share a sense amp 40 and a column decoder 50. On the other hand, the cell array regions CAR adjacent to each other in the y-axis direction may share a row decoder 20 and a word line driver 30. That is, the row decoder 20 and the word line driver 30 may be disposed between the cell array regions CAR adjacent to each other in the y-axis direction.

In a non-memory layer L1, the layout structure of non-memory circuits is not limited to the embodiments illustrated in FIGS. 8 through 12, and may be changed variously.

Figure 13:
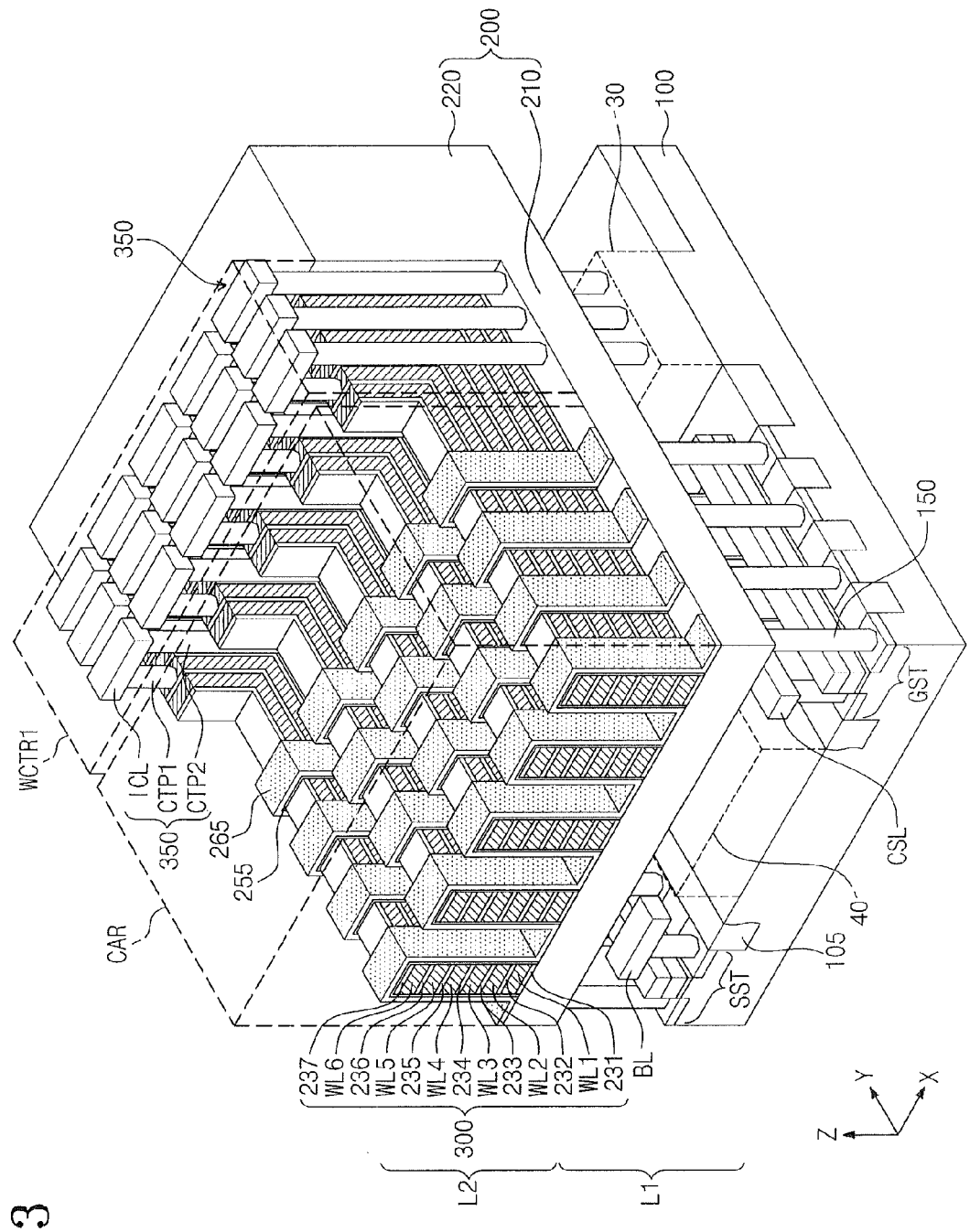
FIG. 13 is a perspective view illustrating a three-dimensional semiconductor memory device according to another embodiment of the inventive concept.
Figure 14:
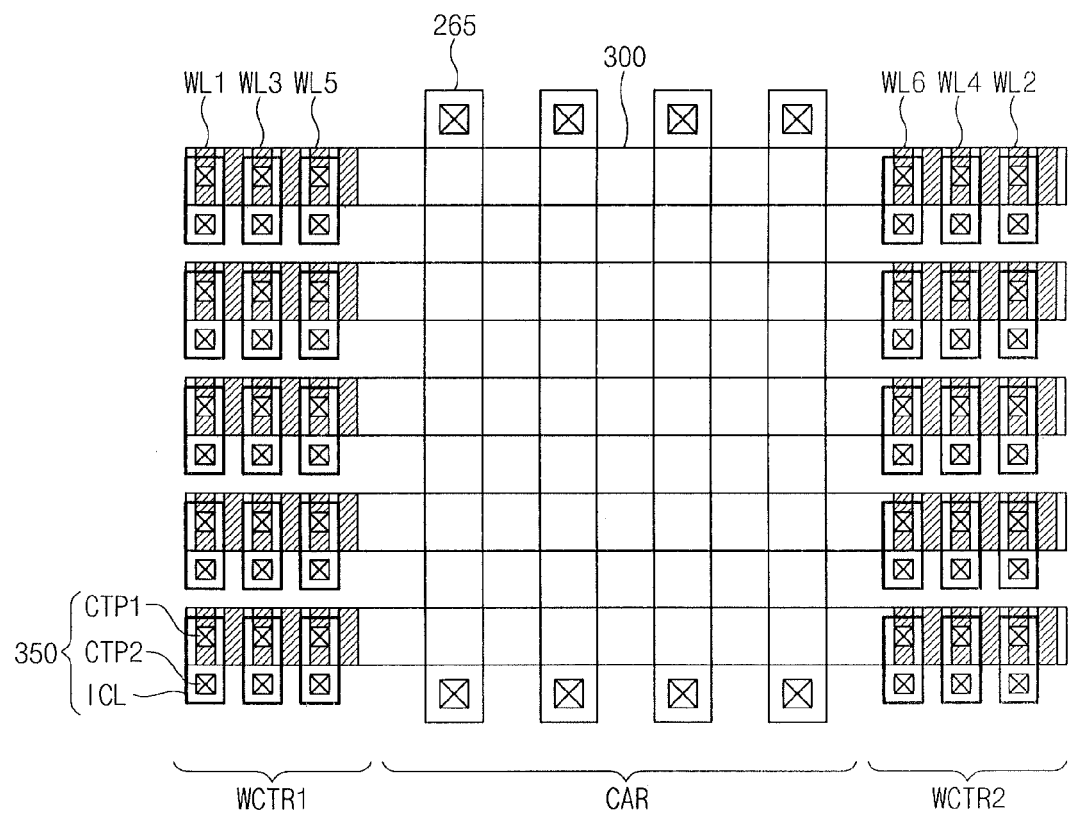
FIGS. 14 and 15 are drawings for describing the disposition structure of an interconnection line structure connecting a word line and a word line driver according to another embodiment of the inventive concept.
Figure 15:
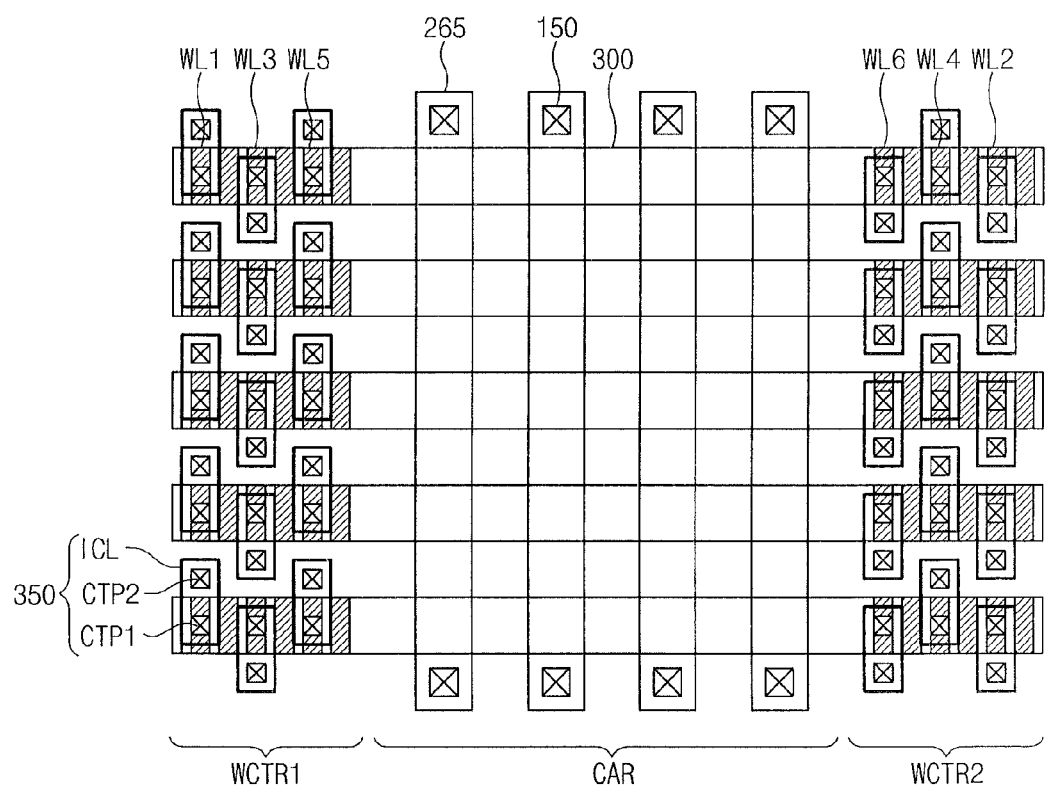

FIG. 13 is a perspective view illustrating a three-dimensional semiconductor memory device according to another embodiment of the inventive concept. FIGS. 14 and 15 are drawings for describing the layout of interconnection line structures connecting a word line and a word line driver according to another embodiment of the inventive concept. Referring to FIG. 13, as described in the foregoing embodiment, a three-dimensional semiconductor memory device includes a non-memory layer L1 and a memory layer L2 which are vertically stacked, and the memory layer L2 may be disposed on the non-memory layer L1. The non-memory layer L1 includes a semiconductor substrate 100, string and ground selection transistors SST and GST constituting a cell string STR, and non-memory circuits. The memory layer L2 includes an insulation layer 200 and unit memory cells (UC in FIG. 2) which are serially connected to the string and selection transistors SST and GST. The unit memory cells (UC in FIG. 2) are three-dimensionally disposed on the insulation layer 200. The unit memory cells (UC in FIG. 2) of the memory layer L2 are electrically connected to the selection transistors SST and GST of the non-memory layer L2, thereby constituting the cell string (STR in FIG. 2).

According to this embodiment, as illustrated in FIGS. 13 through 15, the memory layer L2 includes first and second word line contact regions WCTR1 and WCTR2, and a cell array region CAR therebetween. Referring to FIGS. 13 through 15, in the cell array region CAR, the upper surface of the insulation layer 200 is formed lower than top surfaces of the first and second word line contact regions WCTR1 and WCTR2. According to an embodiment, this structure may be formed through a patterning operation which recesses the insulation layer 200 in the cell array region CAR. The insulation layer 200 thus formed have a recess portion 210 in the cell array region CAR, and may have a protruding portion 220 in the first and second word line contact regions WCTR1 and WCTR2. A side wall of the protruding portion 220, which is formed through the patterning operation, may have a predetermined slope (an angle of about 90 degrees to 130 degrees) with respect to the semiconductor substrate 100. According to another embodiment, the foregoing structure may be formed by forming a predetermined thin film having the thickness corresponding to the step height between the two regions of the insulation layer 200 and then etching the thin film in the cell array region CAR.

In the recess portion 210 of the insulation layer 200, a word line structure 300, in which interlayer insulation layers 231-237 and a plurality of word lines WL1-WL6 are alternatingly stacked, is disposed. The word line structure 300 may be formed conformally in the recess portion 210 of the insulation layer 200. The total thickness of the word line structure 300 in the cell array region CAR may be smaller than the step height between the recess portion 210 and the protruding portion 220. In more detail, each of the word lines WL1-WL6 may include an interconnection line portion parallel to the semiconductor substrate 10 and disposed in the cell array region CAR, and a contact portion disposed in the first and second word line contact regions WCTR1 and WCTR2 and having a slope with respect to the semiconductor substrate 100.

The length of the interconnection line portions of the word lines WL1-WL6 may be decreased as the interconnection line portions go far from the surface of the insulation layer 200. The gap between the interconnection line portions of the word lines WL1-WL6 is determined by the thickness of the interlayer insulation layers 231-237. The thickness of the interlayer insulation layers 231-237 may be selected from a range which satisfies technical characteristics for the overlap of inversion regions described in FIG. 5. However, since the uppermost interlayer insulation layer 237 may be used as an etching mask in a subsequent patterning process, to the uppermost interlayer insulation layer may be formed thicker than other interlayer insulation layers 231-236.

Also, the contact portions of the word lines WL1-WL6 may be far from the protruding portion 220 of the insulation layer 200 as the contact portions go far from the surface of the insulation layer 200. Further, the length of the contact portions of the word lines WL1-WL6 may be shortened as the contact portions go far from a side wall of the protruding portion 220 of the insulation layer 200.

According to this embodiment, as described with reference to FIG. 3, a semiconductor pattern 265 disposed in the memory layer L2 is electrically connected to the selection transistors SST and GST of the non-memory layer L1 through a string connection structure 150. Also, as described with reference to FIG. 7 through 9, the string selection transistor SST and the ground selection transistor GST may be disposed spaced apart from each other in the non-memory layer L1. A sense amp 40 and a column decoder 50 may be disposed on the semiconductor substrate 100 between the selection transistors SST and GST in the non-memory layer L1.

According to this embodiment, a word line driver 30, which is a non-memory circuit, may be disposed under the first and second word line contact regions WCTR1 and WCTR2. In the non-memory layer L1, a layout structure of the non-memory circuits will be described in more detail with reference to FIGS. 18 through 23.

Also, referring to FIGS. 13 through 15, the word line driver 30 in the non-memory layer L1 may contact the contact portion of the word lines WL1-WL6 of the memory layer L2 through a word line connection structure 350. The word line connection structure 350 includes first and second contact plugs CTP1 and CTP2, and interconnection lines ICL. The first contact plug CTP1 may directly contact the contact portion of the word line, and the second contact plug CTP2 may contact the word line driver 30 of the non-memory layer L1. The first and second contact plugs CTP1 and CTP2 may be electrically connected through the interconnection lines ICL. The second contact plugs CTP2 contacting the word line driver 30 may penetrate through the insulation layer 200. Also, as illustrated in FIGS. 14 and 15, the second contact plugs CTP2 may be formed between the word line structures 300. According to another embodiment, the second contact plugs CTP2 may contact the word line driver 30 by penetrating through the protruding portion 220 of the insulation layer 200.

Meanwhile, in first and second word line contact regions WCTR1 and WCTR2, since the gap between the contact portions of word lines WL1-WL6 is determined by the gap between the interconnection lines, the contact portions may be disposed adjacent to each other. As a result, in the formation of the contact plugs CTP1 and CTP2 connected to each of the word lines WL1-WL6, the process margin may decrease. Therefore, as illustrated in FIGS. 14 and 15, first contact plugs CTP1, which are connected to the word lines WL1, WL3 and WL5 disposed at odd-numbered layers, are disposed in the first word line contact region WCTR1. In the second word line contact region WCTR2, the first contact plugs CTP1, which are connected to the word lines WL2, WL4 and WL6 disposed at even-numbered layers, are disposed.

Figure 16:
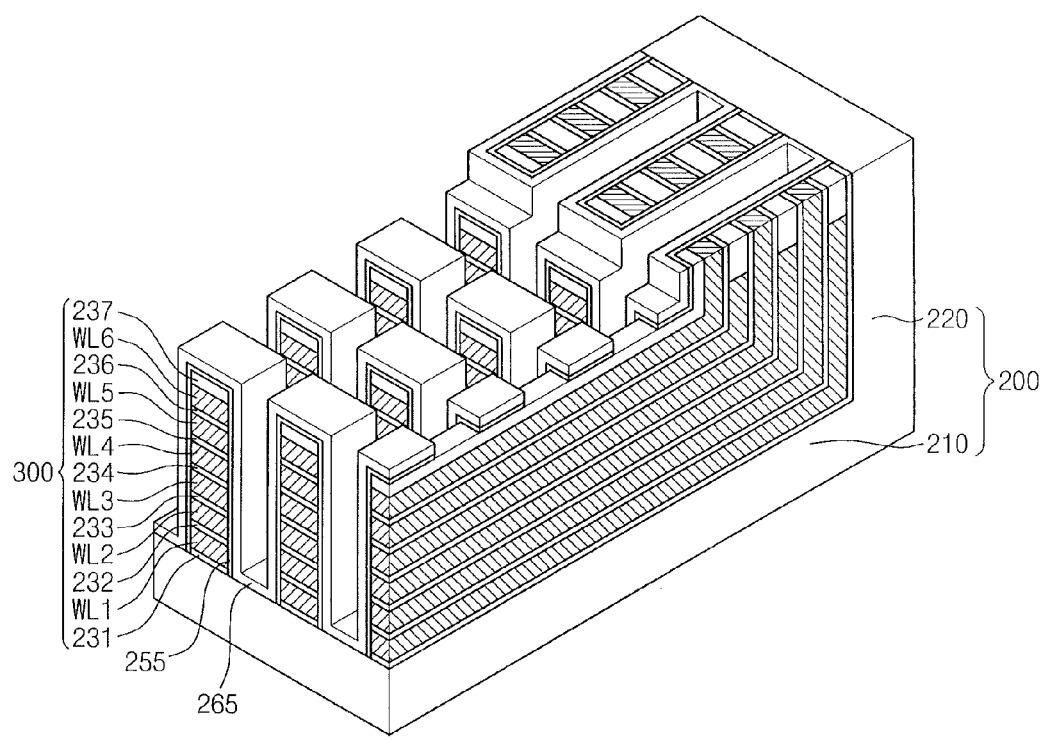
FIGS. 16 and 17 are perspective views for describing the structure of contact portions of word lines according to another embodiment of the inventive concept.
Figure 17:
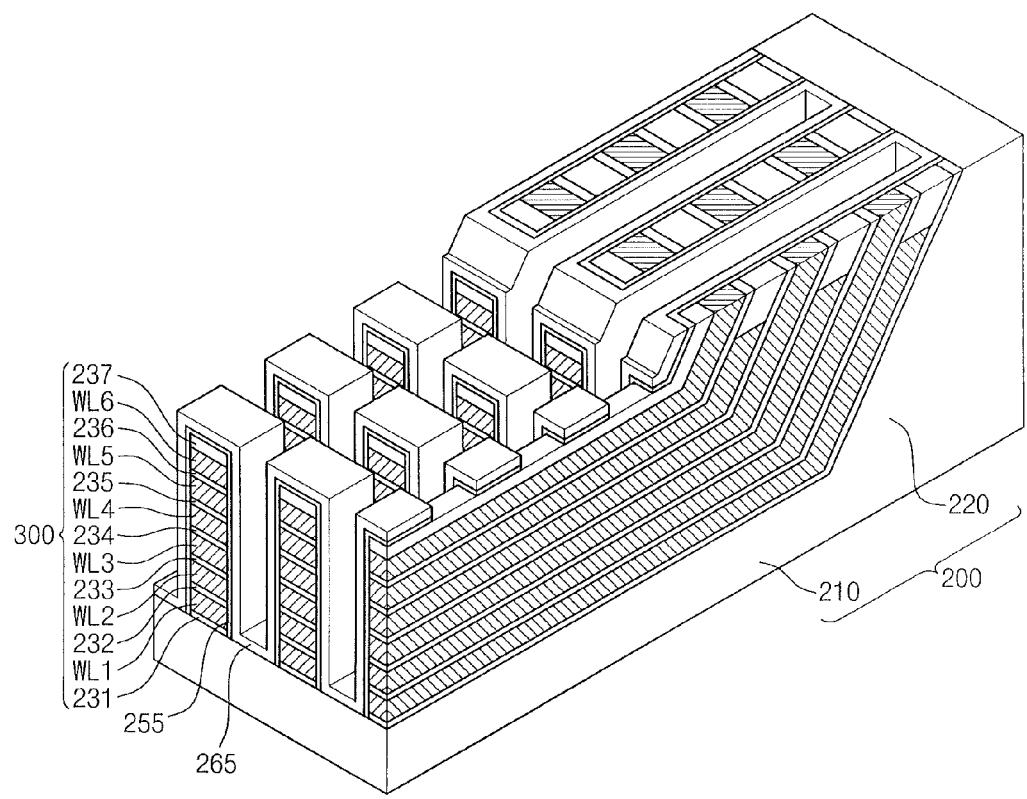

FIGS. 16 and 17 are perspective views for describing the structure of contact portions of word lines according to another embodiment of the inventive concept. Referring to FIGS. 16 and 17, in the first word line contact region CTR1, the contact portions of the word lines WL2, WL4 and WL6, which are disposed at even-numbered layers, may have a structure buried by a dummy insulation pattern. Correspondingly, in the second word line contact region CTR2, the contact portions of word lines WL1, WL3 and WL5, which are disposed at odd-numbered layers, may have a structure buried by the dummy insulation pattern. In other words, in the first word line contact region CTR1, top surfaces of the contact portions of the word lines WL2, WL4 and WL6, which are disposed at even-numbered layers, may be disposed lower than top surfaces of the contact portions of the word lines WL1, WL3 and WL5 disposed at odd-numbered layers. Correspondingly, in the second word line contact region CTR2, top surfaces of the contact portions of the word lines WL1, WL3 and WL5, which are disposed at odd-numbered layers, may be disposed lower than top surfaces of the contact portions of the word lines WL2, WL4 and WL6, which are disposed at even-numbered layers. That is, while the contact portions of the word lines are disposed in the first and second word line contact regions CTR1 and CTR2, the length of the portions extended from the interconnection line portions of the word lines may be different from each other in the first and second word line contact regions CTR1 and CTR2.

Also, the angle between the contact portion and the interconnection line portion of each of the word lines WL1-WL6 may be substantially equal to the angle between the interface, which is between the cell array region CAR and the word line contact regions WCTR1 and WCTR2, and the upper surface of the substrate 100. For example, as illustrated in FIG. 11, in the case where the interface between the cell array region and the word line contact regions WCTR1 and WCTR2 is vertical to the upper surface of the semiconductor substrate 100, the contact portions of the word lines WL1-WL6 are also formed vertically to the semiconductor substrate 100.

Also, according to another embodiment, as illustrated in FIG. 17, in a protruding portion 220 of an insulation layer 200, a side wall adjacent to a cell array region CAR may form smaller degrees than about 90 degrees with respect to the upper surface of the semiconductor substrate 100. In this case, the area of the upper surface of the word lines WL1-WL6, which is exposed by planarization etching described above, increases relative to the foregoing embodiment. Specifically, if the angle of the side wall with respect to the upper surface of the semiconductor substrate 100 is ⊖ and, the thickness and width of the word line are 'a' and 'b', respectively, the exposed area of the word line will be 'ab' in the case of the foregoing embodiments, and will be 'ab/sin ⊖' in the case of this embodiment. Therefore, the exposed area of the word lines WL1-WL6 increases as the angle decreases. According to an embodiment, the angle may be between about 30 degrees and about 90 degrees.

FIGS. 18 through 23 are drawings for describing the disposition structure of non-memory circuits in a three-dimensional semiconductor memory device according to other embodiments of the inventive concept. Referring to FIGS. 18 through 23, a semiconductor substrate 100 includes at least one memory region MR and a peripheral region PR surrounding the memory region MR. String and ground selection transistors SST and GST may be integrated on the memory region MR of the semiconductor substrate 100, and non-memory circuits may be integrated on the peripheral region PR of the semiconductor substrate 100. In a non-memory layer L1, as described with reference to FIGS. 8 through 12, the string and ground selection transistors SST and GST, which are connected to memory cells of a cell array region CAR, and non-memory circuits 20, 30, 40, 50 and 60 may be disposed. Also, a memory layer L2 on the non-memory layer L1, as described with reference to FIGS. 13 through 15, includes first and second word line contact regions WCTR1 and WCTR2, and the cell array region CAR therebetween.

Figure 18:
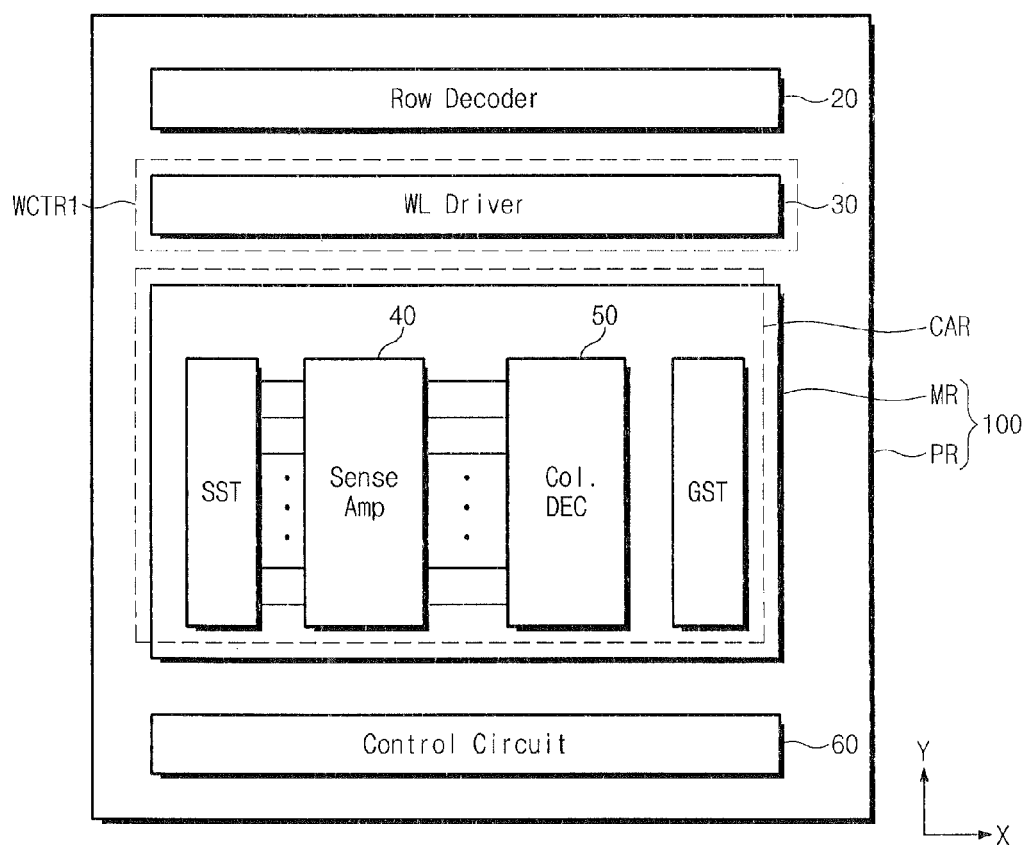
FIGS. 18 through 23 are drawings for describing the layout structure of non-memory circuits in a three-dimensional semiconductor memory device according to another embodiment of the inventive concept.
Figure 19:
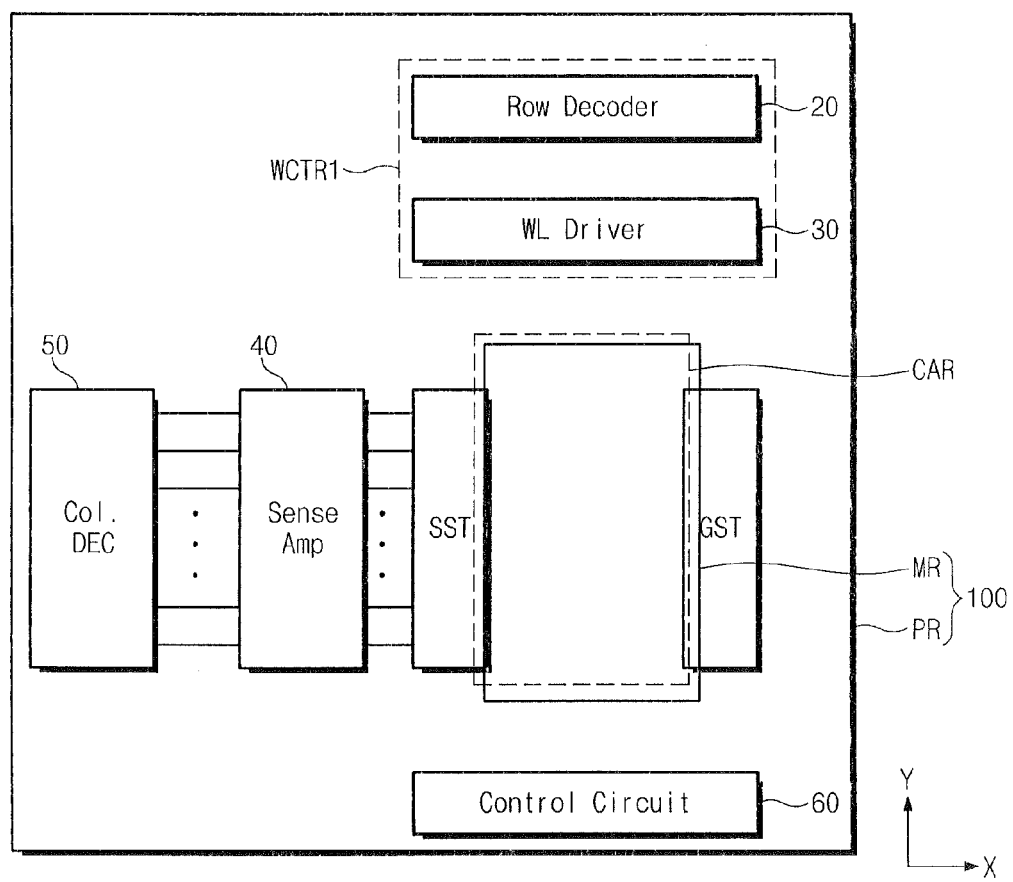

According to the embodiment illustrated in FIGS. 18 and 19, as described with reference to FIG. 8, string and ground selection transistors SST and GST, which are spaced apart from each other, may be disposed in a memory region MR of a semiconductor substrate 100. According to an embodiment, as illustrated in FIG. 18, a sense amp 40 and a column decoder 50 may be disposed between the string and ground selection transistors SST and GST. According to another embodiment, as illustrated in FIG. 19, a cell array region CAR may be disposed in plan view between string and ground selection transistors SST and GST. Also, according to an embodiment, a word line driver 30 may be disposed under a first word line contact region WCTR1. According to another embodiment, a word line driver 30 and a row decoder 20 may be disposed below a first word line contact region WCTR1.

Figure 20:
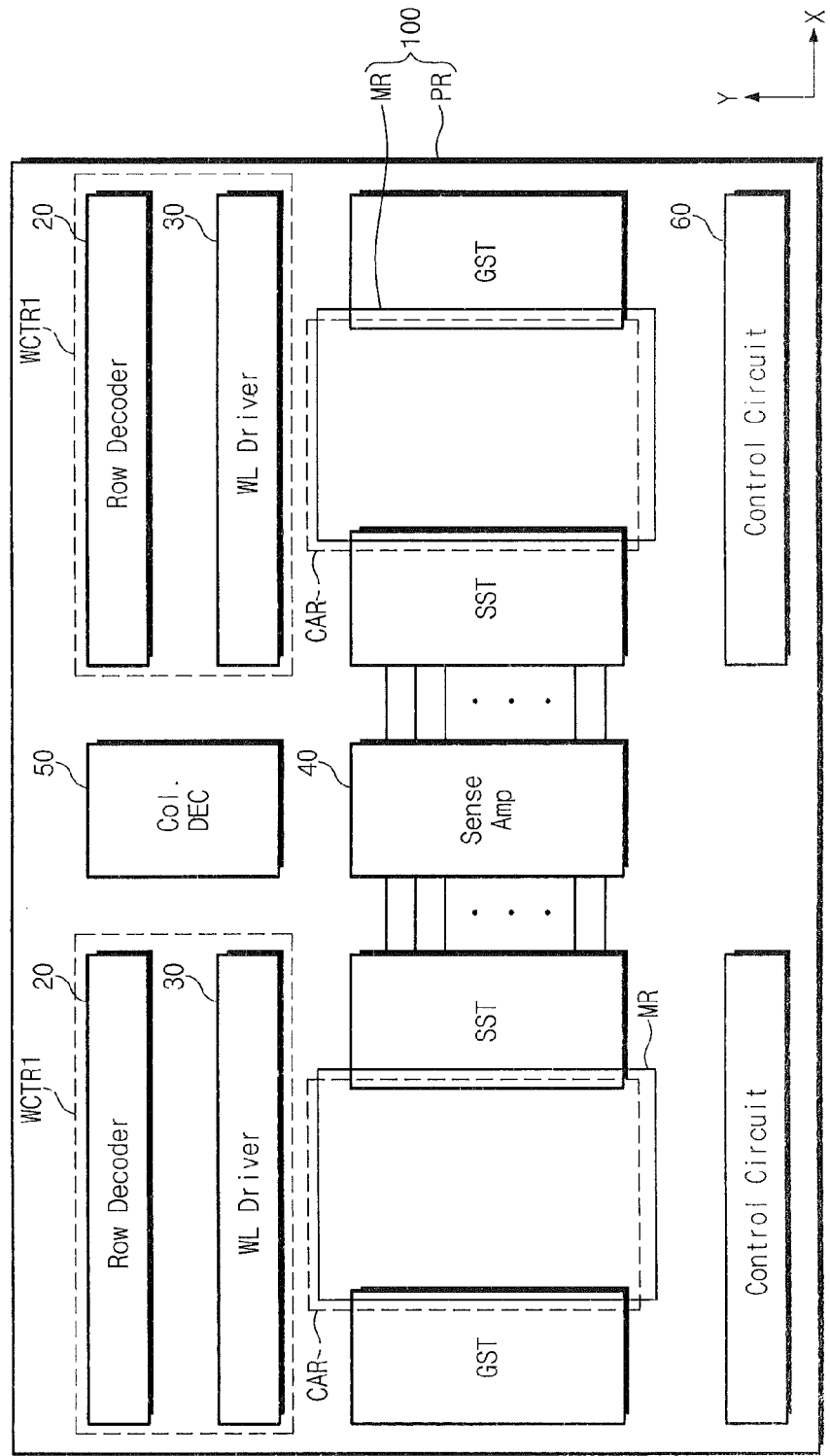

Also, according to the embodiment illustrated in FIG. 20, as described with reference to FIG. 10, at least two or more than memory regions MR may be arranged in the x-axis direction. String and ground selection transistors SST and GST, which are spaced apart from each other, are disposed overlapping in each of the memory regions MR, or each of cell array regions CAR may be disposed in plan view between the string and ground selection transistors SST and GST. Further, the adjacent cell array regions CAR may share a sense amp 40 and a column decoder 50. A word line driver 30 may be disposed under a first word line contact region WCTR1 adjacent to each of the cell array regions CAR.

Figure 21:
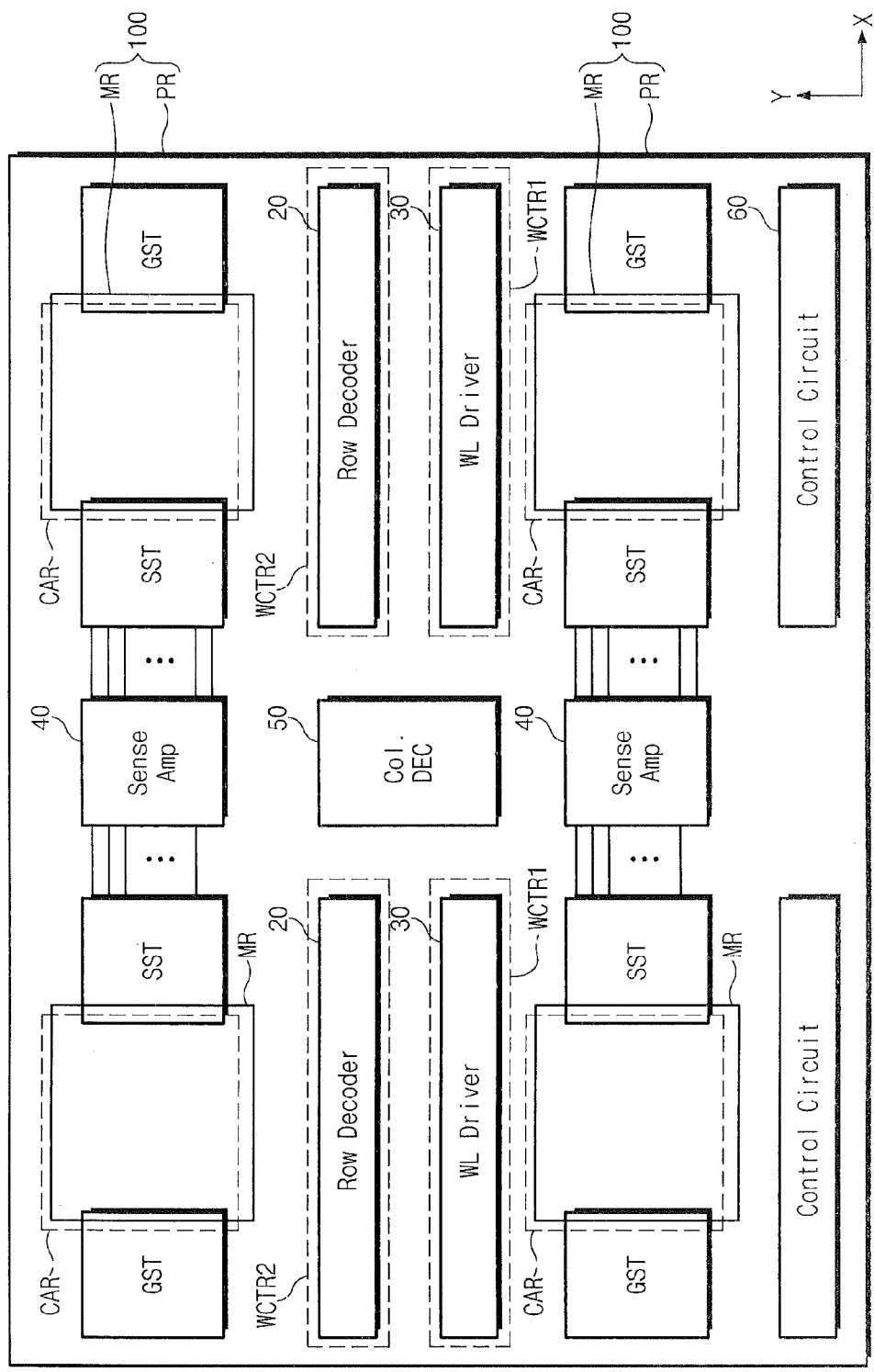

According to the embodiment illustrated in FIG. 21, as described with reference to FIG. 12, at least two or more memory regions MR may be arranged in the x-axis and y-axis directions. String and ground selection transistors SST and GST, which are spaced apart from each other, are disposed in each of the memory regions MR, or each of cell array regions CAR may be disposed in plan view between the string and ground selection transistors SST and GST. Also, according to this embodiment, the cell array regions CAR adjacent to each other in the x-axis direction may share a sense amp 40 and a column decoder 50. The cell array regions CAR adjacent to each other in the y-axis direction may share a row decoder 20 and a word line driver 30. Also, according to an embodiment, a word line driver 30 is disposed under a first word line contact region WCTR1, and a row decoder 20 may be disposed under a second word line contact region WTCR2. According to another embodiment, the row decoder 20 and the word line driver 30 may be disposed under the first word line contact region WCTR1.

Figure 22:
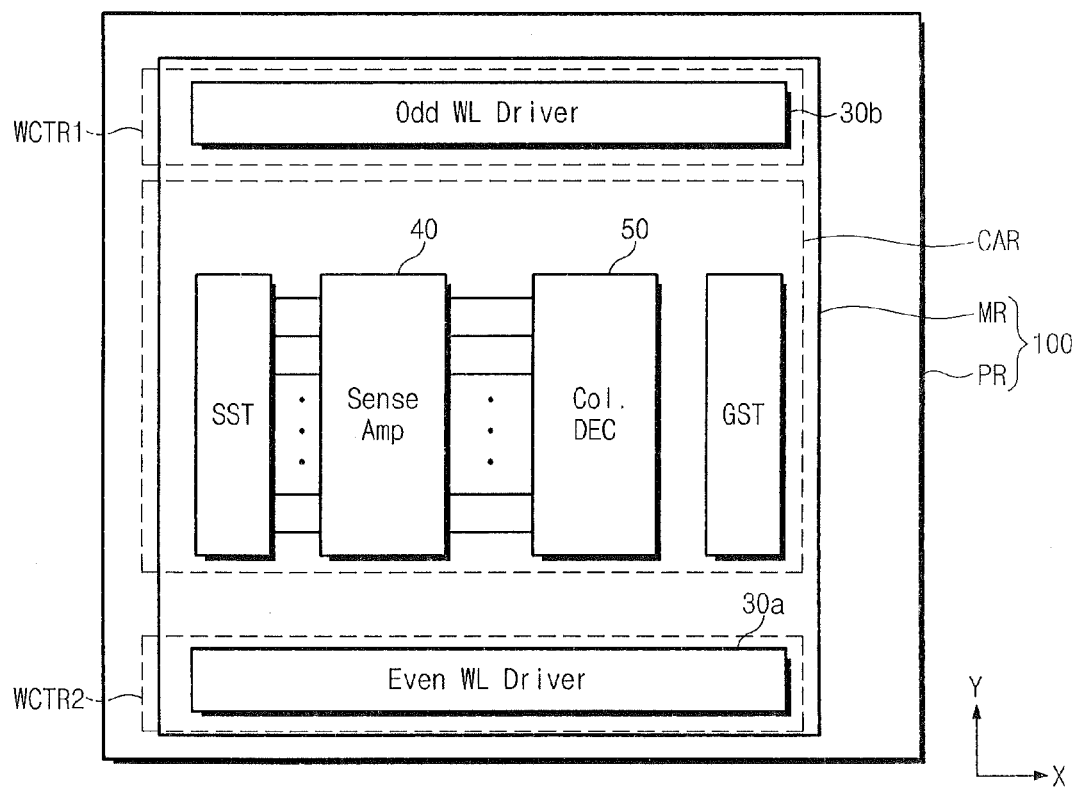

Also, according to the embodiment illustrated in FIG. 22, as described with reference to FIGS. 14 and 15, word line connection structures 350, which are connected to word lines WL1, WL3 and WL5 disposed at odd-numbered layers, may be disposed in a first word line contact region WCTR1. On the other hand, in a second word line contact region WCTR2, the word line connection structures 350, which are connected to the word lines WL2, WL4 and WL6 disposed at even-numbered layers, may be disposed. Therefore, a non-memory layer L1 may include an odd word line driver 30a which drives the word lines WL1, WL3 and WL5 disposed at odd-numbered layers, and an even word line driver 30b which drives the word lines WL2, WL4 and WL6 disposed at even-numbered layers. The odd and even word line drivers 30a and 30b may be disposed in a memory region MR or a peripheral region PR of a semiconductor substrate 100. The odd word line driver 30a and the even word line driver 30b may be disposed spaced apart from each other in the y-axis direction which is perpendicular to the x-axis, the arrangement direction of selection transistors SST and GST. The odd word line driver 30a is disposed under the first word line contact region WCTR1, and the even word line driver 30b may be disposed under the second word line contact region WCTR2.

Figure 23:
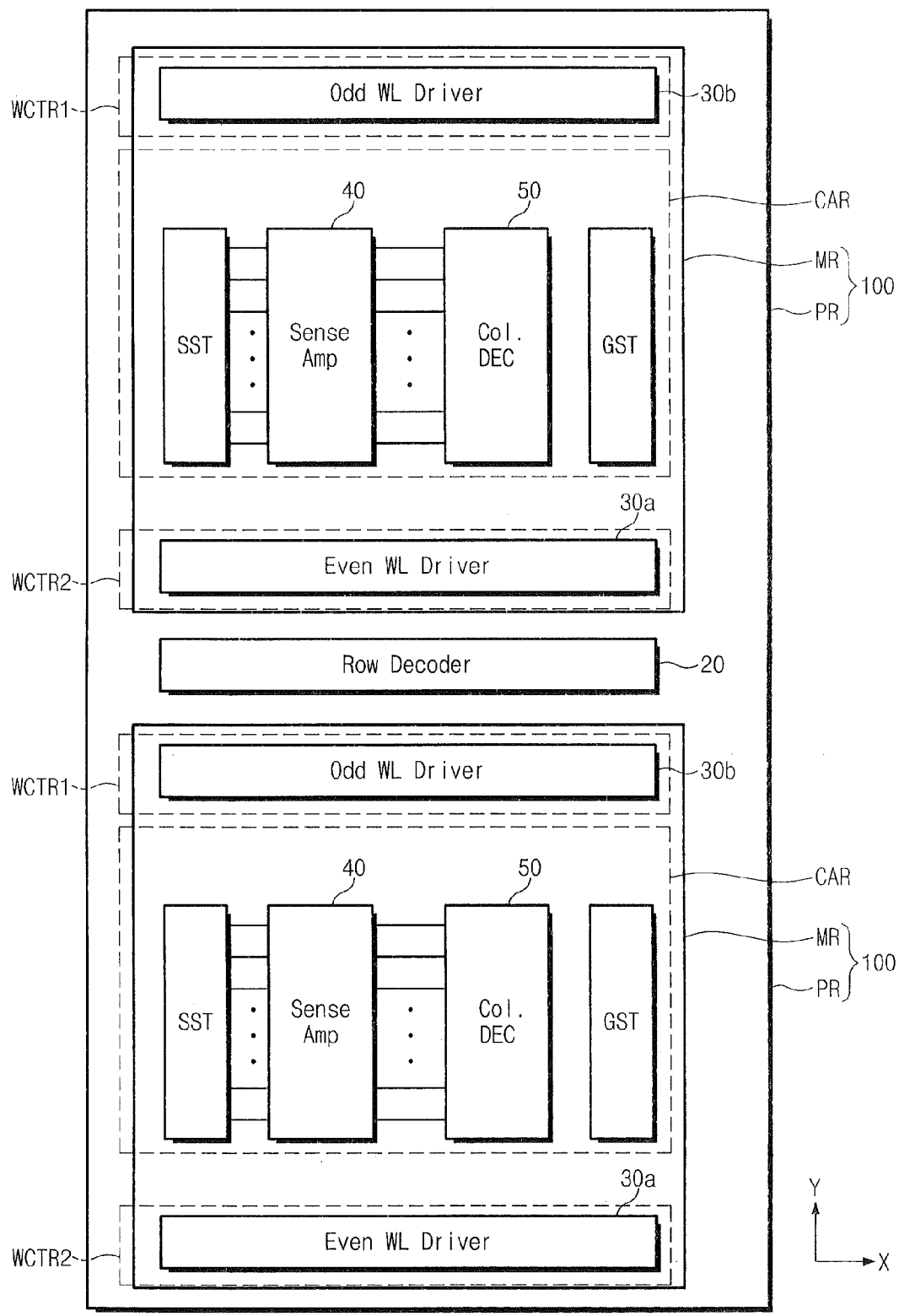

According to the embodiment illustrated in FIG. 23, at least two or more than cell array regions CAR may be arranged in the x-axis direction. At both sides of each of the cell array regions CAR, a first word line contact region WCTR1 and a second word line contact region WCTR2 may be disposed, respectively. Also, a row decoder 20 may be disposed between an odd word line driver 30a and an even word line driver 30b, which are adjacent to each other. In this case, the adjacent cell array regions CAR may share the row decoder 20.

In a non-memory layer L1, the layout structure of non-memory circuits is not limited to this, and may be changed variously.

Figure 24:
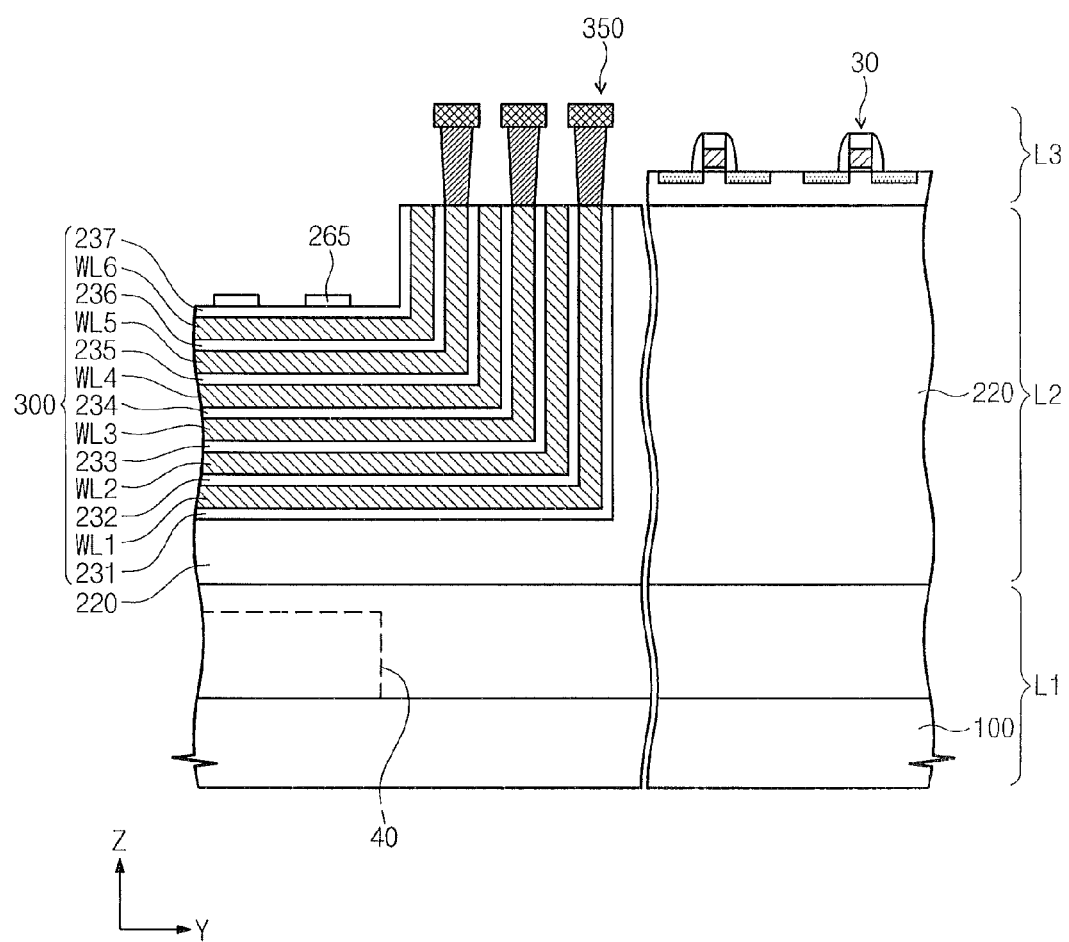
FIG. 24 is a cross-sectional view of a three-dimensional semiconductor device according to another embodiment of the inventive concept.

FIG. 24 is a cross-sectional view of a three-dimensional semiconductor device according to another embodiment of the inventive concept. Referring to FIG. 24, a portion of non-memory circuits may be disposed on memory cells. According to this embodiment, a three-dimensional memory device may include a first non-memory layer L1, a memory layer L2 and a second non-memory layer L3, which are sequentially stacked. That is, the three-dimensionally arranged memory cells may be disposed between the non-memory circuits disposed vertically.

Describing in detail, as described with reference to FIG. 13, a semiconductor pattern 265, which is disposed in a cell array region CAR in the memory layer L2, is electrically connected to selection transistors SST and GST of the first non-memory layer L1. Also, a sense amp (see 40 in FIG. 1) may be disposed on a semiconductor substrate 100 between the selection transistors SST and GST. That is, the sense amp (see 40 in FIG. 1) may be disposed under a recess portion 210 of an insulation layer 200.

Also, according to this embodiment, a word line driver 30, which is connected to word lines WL1-WL6, may be formed on a protruding portion 220 of the insulation layer 200. The word line driver 30 may include a MOSFET comprised of a gate electrode formed on the protruding portion 220 of the insulation layer 200, and source/drain electrodes formed in the protruding portion 220. For this purpose, the protruding portion 220 is formed of a semiconductor material, or may include a semiconductor layer at an upper portion of the protruding portion 220. The word line driver 30 on the protruding portion 220 may be connected to the word lines WL1-WL6 through a word line connection structure 350 formed on the insulation layer 200.

Figure 25:
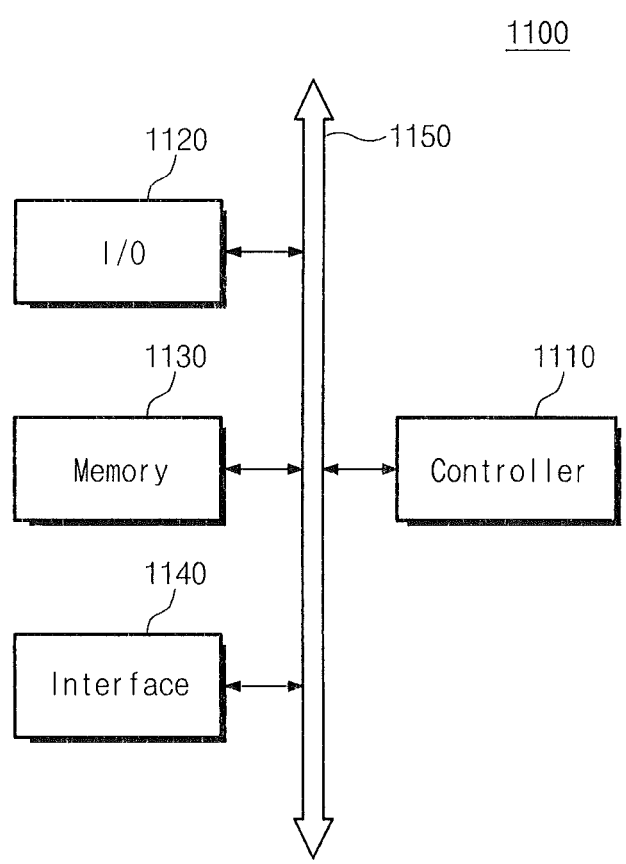
FIG. 25 is a schematic block diagram illustrating an example of a memory system including a three-dimensional semiconductor device according to the embodiments of the inventive concept.

FIG. 25 is a schematic block diagram illustrating an example of a memory system including a three-dimensional semiconductor device according to embodiments of the inventive concept. Referring to FIG. 25, the memory system 1100 may be applied to a personal digital assistant (PDA), a portable computer, a web tablet, a wireless phone, a mobile phone, a digital music player, a memory card and all devices which may transmit and/or receive data in a wireless environment. The memory system 1100 includes an input/output device 1120, such as a controller 1110, a keypad, a key board and a display, a memory 1130, an interface 1140, and a bus 1150. The memory 1130 and the interface 1140 intercommunicate through the bus 1150. The controller 1110 includes at least one micro processor, a digital signal processor, a micro controller and other process devices capable of performing similar functions to the above elements. The memory 1130 may be used to store a command performed by the controller. The input/output device 1120 may input data or a signal from the outside of the system 110 or may output data or a signal to the outside of the system. For example, the input/output device 1120 may include a keyboard, a key pad, and a display device. The memory 1130 includes a non-volatile memory device according to embodiments of the inventive concept. The memory 1130 may further include another kind of memory, a randomly accessible volatile memory and other various kinds of memories. The interface 1140 may serve to transmit/receive data to/from a communication network.

Figure 26:
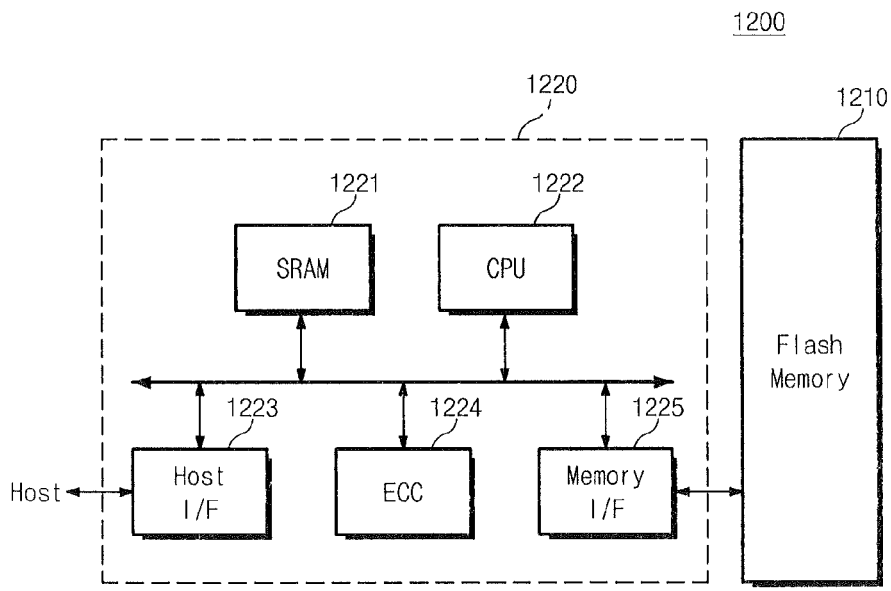
FIG. 26 is a schematic block diagram illustrating an example of a memory card having a three-dimensional semiconductor device according to the embodiments of the inventive concept.

FIG. 26 is a schematic block diagram illustrating an example of a memory card having a three-dimensional semiconductor device according to the embodiments of the inventive concept. Referring to FIG. 26, the memory card 1200, which is for supporting high volume of data storage capacity, is provided with a flash memory device 1210 according to the inventive concept. The memory card 1200 according to the inventive concept includes a memory controller 1220 which controls various data exchanges between a host and the flash memory 1210.

A static random access memory (SRAM) 1221 may be used as a working memory of a processing unit 1222. A host interface 1223 may have a data exchange protocol of the host contacting the memory card 1200. An error correction code 1224 may detect and correct an error which is included in the data read out from the multi-bit flash memory device 1210. A memory interface 1225 is interfacing with the flash memory device 1210 of the inventive concept. The processing unit 1222 performs various control operations for data exchange of the memory controller 1220. Although not illustrated in the drawings, it is obvious to those skill in the art that the memory card 1200 according to the inventive concept may be further supplied with a read only memory (ROM) (not illustrated) or the like which store code data for interfacing with the host.

Figure 27:
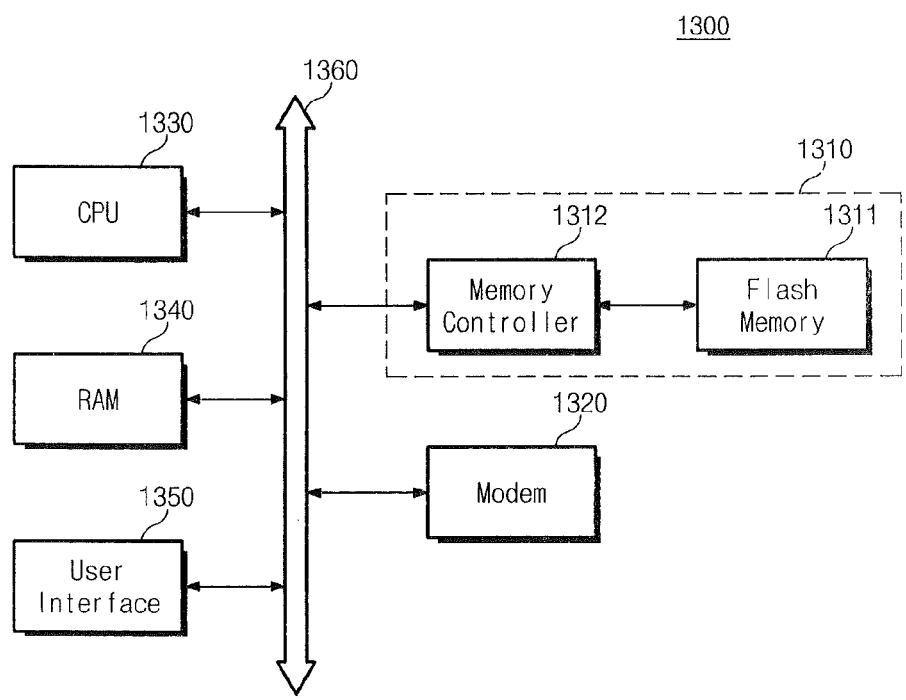
FIG. 27 is a schematic block diagram illustrating an example of a data processing system mounting a three-dimensional semiconductor device according to the inventive concept.

FIG. 27 is a schematic block diagram illustrating an example of a data processing system mounting a three-dimensional semiconductor device according to the inventive concept. Referring to FIG. 27, a flash memory system 1310 of the inventive concept is mounted on a data processing system such as a mobile device or a desktop computer. The data processing system 1300 according to the inventive concept includes the flash memory system 1310, and a modem 1320, a central processing unit 1330, a random access memory (RAM) 1340 and a user interface which electrically connect to a system bus 1360, respectively. The flash memory system 1310 will be composed substantially equal to the memory system or the flash memory system described before. In the flash memory system 1310, the data processed by the central processing unit 1330 or the data inputted from the outside are stored. Herein, the above described flash memory system 1310 may be composed of a solid state disk (SSD), and in this case, the data processing system 1300 may stably store high volume of data in the flash memory system 1310. Due to the increase in reliability, the flash memory system 1310 may reduce the resources required for an error correction, thereby providing a high-speed data exchange function to the data processing system 1300. Although not illustrated in the drawings, it is obvious to those skilled in the art that the data processing system 1300 according to the inventive concept may be further supplied with an application chipset, a camera image processor (CIS) and an input/out device or the like.

Also, the flash memory device or the memory system according to the inventive concept may be mounted in various types of packages. Examples of the packages of the semiconductor devices according to the embodiments of the inventive concept may include package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), a multi chip package (MCP), a wafer-level fabricated package (WFP), a wafer-level processed package (WSP) and so on.

According to a three-dimensional memory device of the inventive concept, in a cell string including memory cells and selection transistors three-dimensionally stacked, the memory cells and the selection transistors are disposed at different levels from each other such that the three-dimensional semiconductor memory device can be more highly integrated. Also, non-memory circuits such as a sense amp and a word line driver are disposed under the memory cells such that the three-dimensional semiconductor memory device can be more highly integrated.

Accordingly, as described above, a nonvolatile memory device may include an electrically insulating layer 200 (L2 and L1) on a semiconductor substrate 100 and a NAND-type string of nonvolatile memory cells on the electrically insulating layer 200. The NAND-type string of nonvolatile memory cells includes a plurality of vertically-stacked nonvolatile memory cell sub-strings (shown as five (5) sub-strings 300 connected in series as one NAND-type string) disposed at side-by-side locations on the electrically insulating layer 200. A string selection transistor SST is provided, which includes a gate electrode extending between the electrically insulating layer 200 and the semiconductor substrate 100 and source and drain regions 110 in the semiconductor substrate 100, as shown by FIGS. 3-4. A ground selection transistor GST is provided, which includes a gate electrode extending between the electrically insulating layer 200 and the semiconductor substrate 100 and source and drain regions 110 in the semiconductor substrate 100. An electrically conductive string selection plug 150 is provided, which extends through the electrically insulating layer 200. This string selection plug 150 electrically connects a drain terminal of a first of the nonvolatile memory cells in the NAND-type string to the source 110 of the string selection transistor SST. An electrically conductive ground selection plug 150 is provided, which extends through the electrically insulating layer 200. This ground selection plug 150 electrically connects a source terminal of a last of the nonvolatile memory cells in the NAND-type string to the drain 110 of the ground selection transistor GST.

The electrically insulating layer 200 includes an upper interlayer insulating layer (200 within L2) on the string selection transistor SST and on the ground selection transistor GST, as illustrated by FIGS. 3-4. The memory device may further include a bit line BL electrically connected to the drain of the string selection transistor SST. The bit line extends between the interlayer insulating layer (200 within L2) and the semiconductor substrate 100. A common source line CSL is also provided, which is electrically connected to the source of the ground selection transistor GST. The common source line CSL extends between the interlayer insulating layer (200 within L2) and the semiconductor substrate 100.

According to additional embodiments of the invention, a sense amplifier 40 is provided, which extends between the string and ground selection transistors and extends between the interlayer insulating layer 200 and the semiconductor substrate 100. A column decoder 50 is provided, which is electrically coupled to the sense amplifier 40, as illustrated by FIG. 8. The column decoder 50 extends between the string and ground selection transistors SST and GST. At least a portion of the sense amplifier extends between the NAND-type string on, nonvolatile memory cells and the semiconductor substrate and at least a portion of the column decoder extends between the NAND-type string on nonvolatile memory cells and the semiconductor substrate.

While the inventive concept has been particularly illustrated and described with reference to exemplary embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A non-volatile memory device, comprising:
  an electrically insulating layer on a semiconductor substrate;
  a NAND-type string of nonvolatile memory cells comprising a plurality of vertically-stacked nonvolatile memory cell sub-strings disposed at side-by-side locations on said electrically insulating layer, said NAND-type string of comprising an impurity-doped semiconductor pattern that extends on opposing sidewalls of each of said plurality of vertically-stacked nonvolatile memory cell sub-strings;
  a string selection transistor comprising a gate electrode extending between said electrically insulating layer and the semiconductor substrate and source and drain regions in the semiconductor substrate;
  an electrically conductive string selection plug extending through said electrically insulating layer and electrically connecting a drain terminal of a first of the nonvolatile memory cells in said NAND-type string to the source of said string selection transistor, said electrically conductive string selection plug contacting a portion of the impurity-doped semiconductor pattern that extends adjacent a base of a first of the plurality of vertically-stacked nonvolatile memory cell sub-strings;
  a ground selection transistor comprising a gate electrode extending between said electrically insulating layer and the semiconductor substrate and source and drain regions in the semiconductor substrate; and
  an electrically conductive ground selection plug extending through said electrically insulating layer and electrically connecting a source terminal of a last of the nonvolatile memory cells in said NAND-type string to the drain of said ground selection transistor, said electrically conductive ground selection plug contacting a portion of the impurity-doped semiconductor pattern that extends adjacent a base of a last of the plurality of vertically-stacked nonvolatile memory cell sub-strings.

2. The memory device of claim 1, wherein said electrically insulating layer comprises an interlayer insulating layer on said string selection transistor and said ground selection transistor; and wherein the memory device further comprises a bit line electrically connected to the drain of said string selection transistor, said bit line extending between the interlayer insulating layer and the semiconductor substrate.

3. The memory device of claim 2, wherein the memory device further comprises a common source line electrically connected to the source of said ground selection transistor, said common source line extending between the interlayer insulating layer and the semiconductor substrate.

4. The memory device of claim 3, further comprising a sense amplifier extending between said string and ground selection transistors.

5. The memory device of claim 4, wherein said sense amplifier extends between the interlayer insulating layer and the semiconductor substrate.

6. The memory device of claim 4, further comprising a column decoder electrically coupled to said sense amplifier, said column decoder extending between said string and ground selection transistors.

7. The memory device of claim 6, wherein at least a portion of said sense amplifier is disposed between said NAND-type string on nonvolatile memory cells and the semiconductor substrate, in a vertical view.

8. The memory device of claim 7, wherein at least a portion of said column decoder is disposed between said NAND-type string on nonvolatile memory cells and the semiconductor substrate, in a vertical view.

* * * * *